United States Patent [19]

Staiger

[11] Patent Number: 5,550,846
[45] Date of Patent: Aug. 27, 1996

[54] CIRCUIT FOR GENERATING AN OUTPUT SEQUENCE OF VALUES

[75] Inventor: Dieter E. Staiger, Weil im Schoenbuch, Germany

[73] Assignee: International Business Machines Corp., Armonk, N.Y.

[21] Appl. No.: 128,951

[22] Filed: Sep. 29, 1993

[30] Foreign Application Priority Data

Sep. 30, 1992 [EP] European Pat. Off. ............... 92116755

[51] Int. Cl.$^6$ .................................................... G06F 11/00
[52] U.S. Cl. ......................... 371/27; 371/21.3; 364/717.5
[58] Field of Search ................. 371/27, 21.3; 364/717.5, 364/717, 931.41, 710.09, 710.1

[56] References Cited

U.S. PATENT DOCUMENTS

| | | | |
|---|---|---|---|
| 3,963,905 | 6/1976 | Gopinath et al. | 331/78 X |
| 4,389,723 | 6/1983 | Nigorikawa et al. | 371/27 |
| 4,905,183 | 2/1990 | Kawaguchi et al. | 371/27 X |
| 5,257,282 | 10/1993 | Adkisson et al. | 364/717 X |
| 5,390,192 | 2/1995 | Fujieda | 371/27 |

FOREIGN PATENT DOCUMENTS

255118  2/1988  European Pat. Off. ......... G01R 31/28

OTHER PUBLICATIONS

Robshaw, "Increasing The Rate of Output for M Sequences" *Electronic Letters*, 12 Sep. 1991, vol. 27 No. 19, pp. 1710–1712.

M. Kanzaki et al., "Programming for Parallel Pattern Generators," Nov. 1, 1991, Proceedings of the INTL Test Conf., Paper 40.1, pp. 1061–1068.

*Primary Examiner*—Emanuel T. Voeltz
*Assistant Examiner*—M. Kemper
*Attorney, Agent, or Firm*—Thornton & Thornton

[57] ABSTRACT

A technique for configuring improved circuit for generating an output sequence of values such as an output sequence used to test memory components or logic circuits. The inventive method is based on the fact that a factorially produced output sequence of values can be broken or divided into partial sequences and factors which may consist of either a single constant or a single mathematically definable term can be defined there from. The partial sequences may be combined by a multiplexor to form the output sequence. This permits a simple, inexpensive circuit for fast interleaving or pulse sequences to be designed. This can be accomplished by analyzing the desired output sequence of values to be created and arranging this output sequence in partial sequences determined by their periodicity. The circuit designed by this approach needs only a single program storage means to control any number of processes, each of which contains only a single respective value and that these processes need be only a simple arithmetic and logic units (ALUs).

6 Claims, 31 Drawing Sheets

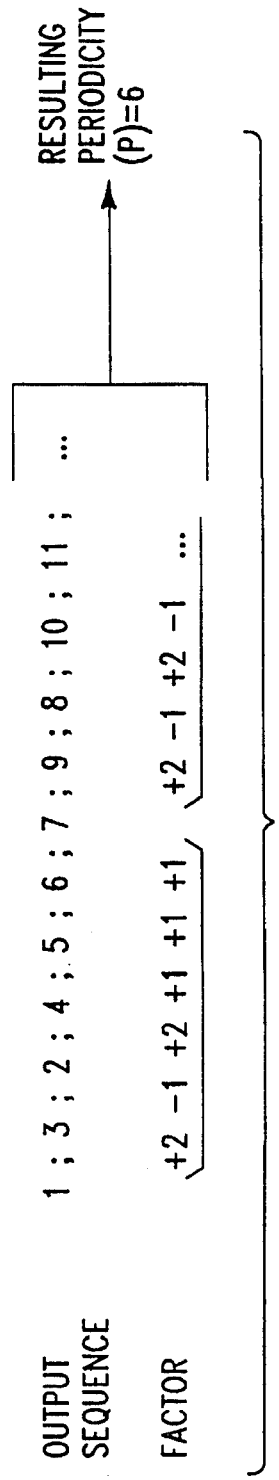

FIG. 3A

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 16 | 17 | 18 | 19 | 20 | 21 | 22 | 23 | 24 | 25 | 26 | 27 | 28 | 29 | 30 | 31 |
| 32 | 33 | 34 | 35 | 36 | 37 | 38 | 39 | 40 | 41 | 42 | 43 | 44 | 45 | 46 | 47 |
| 48 | 49 | 50 | 51 | 52 | 53 | 54 | 55 | 56 | 57 | 58 | 59 | 60 | 61 | 62 | 63 |
| 64 | 65 | 66 | 67 | 68 | 69 | 70 | 71 | 72 | 73 | 74 | 75 | 76 | 77 | 78 | 79 |
| 80 | 81 | 82 | 83 | 84 | 85 | 86 | 87 | 88 | 89 | 90 | 91 | 92 | 93 | 94 | 95 |
| 96 | 97 | 98 | 99 | 100 | 101 | 102 | 103 | 104 | 105 | 106 | 107 | 108 | 109 | 110 | 111 |
| 112 | 113 | 114 | 115 | 116 | 117 | 118 | 119 | 120 | 121 | 122 | 123 | 124 | 125 | 126 | 127 |
| 128 | 129 | 130 | 131 | 132 | 133 | 134 | 135 | 136 | 137 | 138 | 139 | 140 | 141 | 142 | 143 |
| 144 | 145 | 146 | 147 | 148 | 149 | 150 | 151 | 152 | 153 | 154 | 155 | 156 | 157 | 158 | 159 |
| 160 | 161 | 162 | 163 | 164 | 165 | 166 | 167 | 168 | 169 | 170 | 171 | 172 | 173 | 174 | 175 |
| 176 | 177 | 178 | 179 | 180 | 181 | 182 | 183 | 184 | 185 | 186 | 187 | 188 | 189 | 190 | 191 |
| 192 | 193 | 194 | 195 | 196 | 197 | 198 | 199 | 200 | 201 | 202 | 203 | 204 | 205 | 206 | 207 |
| 208 | 209 | 210 | 211 | 212 | 213 | 214 | 215 | 216 | 217 | 218 | 219 | 220 | 221 | 222 | 223 |
| 224 | 225 | 226 | 227 | 228 | 229 | 230 | 231 | 232 | 233 | 234 | 235 | 236 | 237 | 238 | 239 |

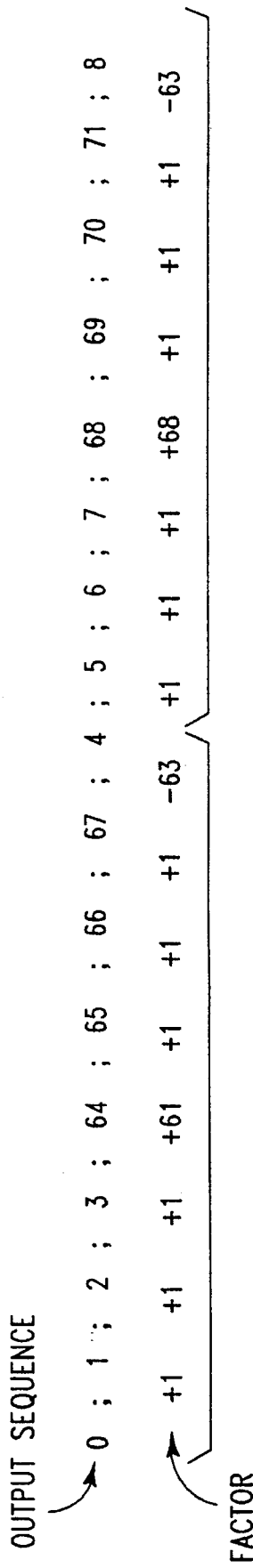

THREE PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 0 | 3 | 66 | 5 | 68 | 71 | 10 | 73 | 12 | 15 | 78 | 17 |
| S2 | 1 | 64 | 67 | 6 | 69 | 8 | 11 | 74 | 13 | 76 | 79 | 18 |
| S3 | 2 | 65 | 4 | 7 | 70 | 9 | 72 | 75 | 14 | 77 | 16 | 19 |

THREE PARTIAL SEQUENCE FACTORS

| a1 | a2 | a3 | a4 | a5 | a6 | a7 | a8 | a9 | a10 | a11 | a12 | a13 |
|---|---|---|---|---|---|---|---|---|---|---|---|---|
| 3 | 63 | −61 | 63 | 3 | −61 | 63 | 3 | −61 | 3 | 63 | −61 | 3 |
| 63 | 3 | −61 | 63 | 3 | −61 | 3 | 63 | −61 | 63 | 3 | 63 | −61 |
| 63 | −61 | 3 | 63 | −61 | 3 | 63 | −61 | 3 | 63 | −61 | 3 | −61 |

PERIODICITY (P) = 8
NUMBER OF DIFFERENT PERIODS = 1

FIG. 3D

FOUR PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 0 | 64 | 4 | 68 | 8 | 72 | 12 | 76 | 16 | 80 | 20 | 84 |
| S2 | 1 | 65 | 5 | 69 | 9 | 73 | 13 | 77 | 17 | 81 | 21 | 85 |
| S3 | 2 | 66 | 6 | 70 | 10 | 74 | 14 | 78 | 18 | 82 | 22 | 86 |
| S4 | 3 | 67 | 7 | 71 | 11 | 75 | 15 | 79 | 19 | 83 | 23 | 87 |

FOUR PARTIAL SEQUENCE FACTORS

| a1 | a2 | a3 | a4 | a5 | a6 | a7 | a8 | a9 | a10 | a11 | a12 | a13 |
|---|---|---|---|---|---|---|---|---|---|---|---|---|
| 64 | −60 | 64 | −60 | 64 | −60 | 64 | −60 | 64 | −60 | 64 | −60 | 64 |
| 64 | −60 | 64 | −60 | 64 | −60 | 64 | −60 | 64 | −60 | 64 | −60 | 64 |
| 64 | −60 | 64 | −60 | 64 | −60 | 64 | −60 | 64 | −60 | 64 | −60 | 64 |
| 64 | −60 | 64 | −60 | 64 | −60 | 64 | −60 | 64 | −60 | 64 | −60 | 64 |

PERIODICITY (P) = 2
NUMBER OF DIFFERENT PERIODS = 1

FIG. 3E

FIVE PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 0 | 65 | 6 | 71 | 72 | 13 | 78 | 19 | 20 | 85 | 26 | 91 |
| S2 | 1 | 66 | 7 | 8 | 73 | 14 | 79 | 80 | 21 | 86 | 27 | 28 |
| S3 | 2 | 67 | 68 | 9 | 74 | 15 | 16 | 81 | 22 | 87 | 88 | 29 |
| S4 | 3 | 4 | 69 | 10 | 75 | 76 | 17 | 82 | 23 | 24 | 89 | 30 |
| S5 | 64 | 5 | 70 | 11 | 12 | 77 | 18 | 83 | 84 | 25 | 90 | 31 |

FIVE PARTIAL SEQUENCE FACTORS

| a1 | a2 | a3 | a4 | a5 | a6 | a7 | a8 | a9 | a10 | a11 | a12 | a13 |
|---|---|---|---|---|---|---|---|---|---|---|---|---|
| 65 | −59 | 65 | 1 | −59 | 65 | −59 | 1 | 65 | −59 | 1 | 1 | −59 |
| 65 | −59 | 1 | 65 | −59 | 65 | 1 | −59 | 65 | −59 | 1 | 65 | −59 |
| 65 | 1 | −59 | 65 | −59 | 65 | −59 | 1 | 65 | −59 | 65 | 1 | −59 |
| 1 | −59 | 65 | 1 | −59 | 65 | −59 | 1 | 65 | −59 | 65 | −59 | 1 |
| −59 | 65 | −59 | 1 | 65 | −59 | 65 | 1 | −59 | 65 | −59 | 1 | 65 |

PERIODICITY (P) = 8
NUMBER OF DIFFERENT PERIODS = 1

FIG. 3F

SIX PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 0 | 66 | 68 | 10 | 12 | 78 | 80 | 22 | 24 | 90 | 92 | 34 |
| S2 | 1 | 67 | 69 | 11 | 13 | 79 | 81 | 23 | 25 | 91 | 93 | 35 |
| S3 | 2 | 4 | 70 | 72 | 14 | 16 | 82 | 84 | 26 | 28 | 94 | 96 |
| S4 | 3 | 5 | 71 | 73 | 15 | 17 | 83 | 85 | 27 | 29 | 95 | 97 |
| S5 | 64 | 6 | 8 | 74 | 76 | 18 | 20 | 86 | 88 | 30 | 32 | 98 |
| S6 | 65 | 7 | 9 | 75 | 77 | 19 | 21 | 87 | 89 | 31 | 33 | 99 |

SIX PARTIAL SEQUENCE FACTORS

| | a1 | a2 | a3 | a4 | a5 | a6 | a7 | a8 | a9 | a10 | a11 | a12 | a13 |
|---|---|---|---|---|---|---|---|---|---|---|---|---|---|
| S1 | 66 | 2 | −58 | 2 | 66 | 2 | −58 | 2 | 66 | 2 | −58 | 2 | 66 |
| S2 | 66 | 2 | −58 | 2 | 66 | 2 | −58 | 2 | 66 | 2 | −58 | 2 | 66 |
| S3 | 2 | 66 | 2 | −58 | 2 | 66 | 2 | −58 | 2 | 66 | 2 | −58 | 2 |
| S4 | 2 | 66 | 2 | −58 | 2 | 66 | 2 | −58 | 2 | 66 | 2 | −58 | 2 |
| S5 | −58 | 2 | 66 | 2 | −58 | 2 | 66 | 2 | −58 | 2 | 66 | 2 | −58 |
| S6 | −58 | 2 | 66 | 2 | −58 | 2 | 66 | 2 | −58 | 2 | 66 | 2 | −58 |

PERIODICITY (P) = 4
NUMBER OF DIFFERENT PERIODS = 1

FIG. 3G

SEVEN PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 0 | 67 | 70 | 73 | 76 | 19 | 22 | 25 | 28 | 95 | 98 | 101 |
| S2 | 1 | 4 | 71 | 74 | 77 | 80 | 23 | 26 | 29 | 32 | 99 | 102 |
| S3 | 2 | 5 | 8 | 75 | 78 | 81 | 84 | 27 | 30 | 33 | 36 | 103 |
| S4 | 3 | 6 | 9 | 12 | 79 | 82 | 85 | 88 | 31 | 34 | 37 | 40 |
| S5 | 64 | 7 | 10 | 13 | 16 | 83 | 86 | 89 | 92 | 35 | 38 | 41 |
| S6 | 65 | 68 | 11 | 14 | 17 | 20 | 87 | 90 | 93 | 96 | 39 | 42 |
| S7 | 66 | 69 | 72 | 15 | 18 | 21 | 24 | 91 | 94 | 97 | 100 | 43 |

SEVEN PARTIAL SEQUENCE FACTORS

| a1 | a2 | a3 | a4 | a5 | a6 | a7 | a8 | a9 | a10 | a11 | a12 | a13 |
|---|---|---|---|---|---|---|---|---|---|---|---|---|
| 67 | 3 | 3 | 3 | -57 | 3 | 3 | 3 | 67 | 3 | 3 | 3 | -57 |
| 3 | 67 | 3 | 3 | 3 | -57 | 3 | 3 | 3 | 67 | 3 | 3 | 3 |
| 3 | 3 | 67 | 3 | 3 | 3 | -57 | 3 | 3 | 3 | 67 | 3 | 3 |
| 3 | 3 | 3 | 67 | 3 | 3 | 3 | -57 | 3 | 3 | 3 | 67 | 3 |
| 3 | 3 | 3 | 3 | 67 | 3 | 3 | 3 | -57 | 3 | 3 | 3 | 67 |
| -57 | 3 | 3 | 3 | 3 | 67 | 3 | 3 | 3 | -57 | 3 | 3 | 3 |
| 3 | -57 | 3 | 3 | 3 | 3 | 67 | 3 | 3 | 3 | -57 | 3 | 3 |
| 3 | 3 | -57 | 3 | 3 | 3 | 3 | 67 | 3 | 3 | 3 | -57 | 3 |

PERIODICITY (P) = 8
NUMBER OF DIFFERENT PERIODS = 1

FIG. 3H

EIGHT PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 0 | 4 | 8 | 12 | 16 | 20 | 24 | 28 | 32 | 36 | 40 | 44 |
| S2 | 1 | 5 | 9 | 13 | 17 | 21 | 25 | 29 | 33 | 37 | 41 | 45 |
| S3 | 2 | 6 | 10 | 14 | 18 | 22 | 26 | 30 | 34 | 38 | 42 | 46 |
| S4 | 3 | 7 | 11 | 15 | 19 | 23 | 27 | 31 | 35 | 39 | 43 | 47 |
| S5 | 64 | 68 | 72 | 76 | 80 | 84 | 88 | 92 | 96 | 100 | 104 | 108 |
| S6 | 65 | 69 | 73 | 77 | 81 | 85 | 89 | 93 | 97 | 101 | 105 | 109 |
| S7 | 66 | 70 | 74 | 78 | 82 | 86 | 90 | 94 | 98 | 102 | 106 | 110 |
| S8 | 67 | 71 | 75 | 79 | 83 | 87 | 91 | 95 | 99 | 103 | 107 | 111 |

EIGHT PARTIAL SEQUENCE FACTORS

| a1 | a2 | a3 | a4 | a5 | a6 | a7 | a8 | a9 | a10 | a11 | a12 | a13 |
|---|---|---|---|---|---|---|---|---|---|---|---|---|
| 4 | 4 | 4 | 4 | 4 | 4 | 4 | 4 | 4 | 4 | 4 | 4 | 4 |
| 4 | 4 | 4 | 4 | 4 | 4 | 4 | 4 | 4 | 4 | 4 | 4 | 4 |
| 4 | 4 | 4 | 4 | 4 | 4 | 4 | 4 | 4 | 4 | 4 | 4 | 4 |
| 4 | 4 | 4 | 4 | 4 | 4 | 4 | 4 | 4 | 4 | 4 | 4 | 4 |
| 4 | 4 | 4 | 4 | 4 | 4 | 4 | 4 | 4 | 4 | 4 | 4 | 4 |
| 4 | 4 | 4 | 4 | 4 | 4 | 4 | 4 | 4 | 4 | 4 | 4 | 4 |
| 4 | 4 | 4 | 4 | 4 | 4 | 4 | 4 | 4 | 4 | 4 | 4 | 4 |
| 4 | 4 | 4 | 4 | 4 | 4 | 4 | 4 | 4 | 4 | 4 | 4 | 4 |

PERIODICITY (P) = 1
NUMBER OF DIFFERENT PERIODS = 1

NINE PARTIAL SEQUENCES

|    | c1 | c2 | c3 | c4 | c5 | c6 | c7 | c8 | c9 | c10 | c11 | c12 |
|----|----|----|----|----|----|----|----|----|----|-----|-----|-----|
| S1 | 0  | 5  | 10 | 15 | 80 | 85 | 90 | 95 | 36 | 41  | 46  | 51  |
| S2 | 1  | 6  | 11 | 76 | 81 | 86 | 91 | 32 | 37 | 42  | 47  | 112 |
| S3 | 2  | 7  | 72 | 77 | 82 | 87 | 28 | 33 | 38 | 43  | 108 | 113 |
| S4 | 3  | 68 | 73 | 78 | 83 | 24 | 29 | 34 | 39 | 104 | 109 | 114 |
| S5 | 64 | 69 | 74 | 79 | 20 | 25 | 30 | 35 | 100| 105 | 110 | 115 |
| S6 | 65 | 70 | 75 | 16 | 21 | 26 | 31 | 96 | 101| 106 | 111 | 52  |
| S7 | 66 | 71 | 12 | 17 | 22 | 27 | 92 | 97 | 102| 107 | 48  | 53  |
| S8 | 67 | 8  | 13 | 18 | 23 | 88 | 93 | 98 | 103| 44  | 49  | 54  |
| S9 | 4  | 9  | 14 | 19 | 84 | 89 | 94 | 99 | 40 | 45  | 50  | 55  |

NINE PARTIAL SEQUENCE FACTORS

|    | a1 | a2 | a3 | a4 | a5 | a6 | a7 | a8 | a9 | a10 | a11 | a12 |
|----|----|----|----|----|----|----|----|----|----|-----|-----|-----|
| S1 | 5  | 5  | 5  | 5  | 5  | 5  | 5  | -59| 5  | 5   | 5   | 65  |
| S2 | 5  | 5  | 5  | 5  | 5  | 5  | -59| 5  | 5  | 5   | 65  | 5   |
| S3 | 5  | 5  | 5  | 5  | 5  | -59| 5  | 5  | 5  | 65  | 5   | 5   |
| S4 | 5  | 5  | 5  | 5  | -59| 5  | 5  | 5  | 65 | 5   | 5   | 5   |
| S5 | 5  | 5  | 5  | -59| 5  | 5  | 5  | 65 | 5  | 5   | 5   | -59 |
| S6 | 5  | 5  | -59| 5  | 5  | 5  | 65 | 5  | 5  | 5   | -59 | 5   |
| S7 | 5  | -59| 5  | 5  | 5  | 65 | 5  | 5  | 5  | -59 | 5   | 5   |
| S8 | -59| 5  | 5  | 5  | 65 | 5  | 5  | 5  | -59| 5   | 5   | 5   |
| S9 | 5  | 5  | 5  | 65 | 5  | 5  | 5  | -59| 5  | 5   | 5   | 65  |

PERIODICITY (P) = 8
NUMBER OF DIFFERENT PERIODS = 1

TEN PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 0 | 6 | 72 | 78 | 20 | 26 | 92 | 98 | 40 | 46 | 112 | 118 |
| S2 | 1 | 7 | 73 | 79 | 21 | 27 | 93 | 99 | 41 | 47 | 113 | 119 |
| S3 | 2 | 68 | 74 | 16 | 22 | 88 | 94 | 36 | 42 | 108 | 114 | 56 |
| S4 | 3 | 69 | 75 | 17 | 23 | 89 | 95 | 37 | 43 | 109 | 115 | 57 |
| S5 | 64 | 70 | 12 | 18 | 84 | 90 | 32 | 38 | 104 | 110 | 52 | 58 |
| S6 | 65 | 71 | 13 | 19 | 85 | 91 | 33 | 39 | 105 | 111 | 53 | 59 |
| S7 | 66 | 8 | 14 | 80 | 86 | 28 | 34 | 100 | 106 | 48 | 54 | 120 |
| S8 | 67 | 9 | 15 | 81 | 87 | 29 | 35 | 101 | 107 | 49 | 55 | 121 |
| S9 | 4 | 10 | 76 | 82 | 24 | 30 | 96 | 102 | 44 | 50 | 116 | 122 |
| S10 | 5 | 11 | 77 | 83 | 25 | 31 | 97 | 103 | 45 | 51 | 117 | 123 |

TEN PARTIAL SEQUENCE FACTORS

| a1 | a2 | a3 | a4 | a5 | a6 | a7 | a8 | a9 | a10 | a11 | a12 |
|---|---|---|---|---|---|---|---|---|---|---|---|
| 6 | 66 | 6 | −58 | 6 | 66 | 6 | −58 | 6 | 66 | 6 | −58 |
| 6 | 66 | 6 | −58 | 6 | 66 | 6 | −58 | 6 | 66 | 6 | −58 |
| 66 | 6 | −58 | 6 | 66 | 6 | −58 | 6 | 66 | 6 | −58 | 6 |
| 66 | 6 | −58 | 6 | 66 | 6 | −58 | 6 | 66 | 6 | −58 | 6 |
| 6 | −58 | 6 | 66 | 6 | −58 | 6 | 66 | 6 | −58 | 6 | 66 |
| 6 | −58 | 6 | 66 | 6 | −58 | 6 | 66 | 6 | −58 | 6 | 66 |
| −58 | 6 | 66 | 6 | −58 | 6 | 66 | 6 | −58 | 6 | 66 | 5 |
| −58 | 6 | 66 | 6 | −58 | 6 | 66 | 6 | −58 | 6 | 66 | 5 |
| 6 | 66 | 6 | −58 | 6 | 66 | 6 | −58 | 6 | 66 | 6 | −58 |
| 6 | 66 | 6 | −58 | 6 | 66 | 6 | −58 | 6 | 66 | 6 | −58 |

PERIODICITY (P) = 4
NUMBER OF DIFFERENT PERIODS = 1

OUTPUT SEQUENCE
17 ; 0 ; 16 ; 32 ; 33 ; 34 ; 18 ; 2 ; 1 ; 17 ; 33 ; 16 ; 32 ; 48 ; 49 ; 50 ; 34 ; 18 ; 17

FACTOR
−17 +16 +16 +1 +1 −16 −16 −1 +16 +15 −17 +16 +16 +1 +1 −16 −16 −1

PERIODICITY (P) = 10
NUMBER OF DIFFERENT PERIODS = 1

| OUTPUT SEQUENCE | | | | | | | | | | | |
|---|---|---|---|---|---|---|---|---|---|---|---|
| C1 | C2 | C3 | C4 | C5 | C6 | C7 | C8 | C9 | C10 | C11 | C12 |
| 17 | 0 | 16 | 32 | 33 | 34 | 18 | 2 | 1 | 17 | 33 | 16 |

| FACTOR | | | | | | | | | | | |
|---|---|---|---|---|---|---|---|---|---|---|---|
| A1 | A2 | A3 | A4 | A5 | A6 | A7 | A8 | A9 | A10 | A11 | A12 |
| −17 | 16 | 16 | 1 | 1 | −16 | −16 | −1 | 16 | 15 | −17 | 16 |

PERIODICITY (P) = 10

FIG. 4B

TWO PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 17 | 16 | 33 | 18 | 1 | 33 | 32 | 49 | 34 | 17 | 49 | 48 |
| S2 | 0 | 32 | 34 | 2 | 17 | 16 | 48 | 50 | 18 | 33 | 32 | 64 |

TWO PARTIAL SEQUENCE FACTORS

| | a1 | a2 | a3 | a4 | a5 | a6 | a7 | a8 | a9 | a10 | a11 | a12 | a13 |
|---|---|---|---|---|---|---|---|---|---|---|---|---|---|
| | −1 | 17 | −15 | −17 | 32 | −1 | 17 | −15 | −17 | 32 | −1 | 17 | −15 |
| | 32 | 2 | −32 | 15 | −1 | 32 | 2 | −32 | 15 | −1 | 32 | 2 | 32 |

PERIODICITY (P) = 5
NUMBER OF DIFFERENT PERIODS = 2

THREE PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 17 | 32 | 18 | 17 | 32 | 50 | 17 | 32 | 65 | 34 | 65 | 80 |
| S2 | 0 | 33 | 2 | 33 | 48 | 34 | 33 | 48 | 66 | 33 | 48 | 81 |
| S3 | 16 | 34 | 1 | 16 | 49 | 18 | 49 | 64 | 50 | 49 | 64 | 82 |

THREE PARTIAL SEQUENCE FACTORS

| | a1 | a2 | a3 | a4 | a5 | a6 | a7 | a8 | a9 | a10 | a11 | a12 | a13 |
|---|---|---|---|---|---|---|---|---|---|---|---|---|---|
| S1 | 15 | −14 | −1 | 15 | 18 | −33 | 15 | 33 | −31 | 31 | 15 | −14 | −1 |
| S2 | 33 | −31 | 31 | 15 | −14 | −1 | 15 | 18 | −33 | 15 | 33 | −31 | 31 |
| S3 | 18 | −33 | 15 | 33 | −31 | 31 | 15 | −14 | −1 | 15 | 18 | −33 | 15 |

PERIODICITY (P) = 10
NUMBER OF DIFFERENT PERIODS = 1

FIG. 4E

FOUR PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 17 | 33 | 1 | 32 | 34 | 49 | 65 | 33 | 64 | 66 | 81 | 97 |
| S2 | 0 | 34 | 17 | 48 | 18 | 32 | 66 | 49 | 80 | 50 | 64 | 98 |
| S3 | 16 | 18 | 33 | 49 | 17 | 48 | 50 | 65 | 81 | 49 | 80 | 82 |
| S4 | 32 | 2 | 16 | 50 | 33 | 64 | 34 | 48 | 82 | 65 | 96 | 66 |

FOUR PARTIAL SEQUENCE FACTORS

| | a1 | a2 | a3 | a4 | a5 | a6 | a7 | a8 | a9 | a10 | a11 | a12 | a13 |
|---|---|---|---|---|---|---|---|---|---|---|---|---|---|
| S1 | 16 | −32 | 31 | 2 | 15 | 16 | −32 | 31 | 2 | 15 | 16 | −32 | 31 |
| S2 | 34 | −17 | 31 | −30 | 14 | 34 | −17 | 31 | −30 | 14 | 34 | −17 | 31 |
| S3 | 2 | 15 | 16 | −32 | 31 | 2 | 15 | 16 | −32 | 31 | 2 | 5 | 26 |
| S4 | −30 | 14 | 34 | −17 | 31 | 30 | 14 | 34 | −17 | 31 | −30 | 14 | 34 |

PERIODICITY (P) = 5
NUMBER OF DIFFERENT PERIODS = 2

FIVE PARTIAL SEQUENCE FACTORS

|    | a1  | a2 | a3 | a4 | a5 | a6 | a7 | a8 | a9  | a10 | a11 | a12 | a13 |
|----|-----|-----|-----|-----|-----|-----|-----|-----|-----|-----|-----|-----|-----|
|    | 17  | -1  | 17  | -1  | 17  | -1  | 17  | -1  | 17  | -1  | 17  | -1  | 17  |
|    | 18  | -2  | 18  | -2  | 18  | -2  | 18  | -2  | 18  |     |     |     |     |
|    | -14 | 30  | -14 | 30  | -14 | 30  | -14 |     |     |     |     |     |     |
|    | -31 | 47  | -31 | 47  | -31 | 47  |     |     |     |     |     |     |     |
|    | -16 | 32  | -16 | 32  | -16 | 32  | -16 |     |     |     |     |     |     |

PERIODICITY (P) = 2
NUMBER OF DIFFERENT PERIODS = 5

FIVE PARTIAL SEQUENCES

|    | c1 | c2 | c3 | c4 | c5 | c6 | c7 | c8 | c9 | c10 | c11 | c12 |
|----|-----|-----|-----|-----|-----|-----|-----|-----|-----|-----|-----|-----|
| S1 | 17 | 34 | 33 | 50 | 49 | 66 | 65 | 82 | 81 | 98  | 97  | 114 |
| S2 | 0  | 18 | 16 | 34 | 32 | 50 | 48 | 66 | 64 | 82  | 80  | 98  |
| S3 | 16 | 2  | 32 | 18 | 48 | 34 | 64 | 50 | 80 | 66  | 96  | 82  |
| S4 | 32 | 1  | 48 | 17 | 64 | 33 | 80 | 49 | 96 | 65  | 112 | 81  |
| S5 | 33 | 17 | 49 | 33 | 65 | 49 | 81 | 65 | 97 | 81  | 113 | 97  |

FIG. 4F

SIX PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 17 | 18 | 32 | 17 | 65 | 65 | 66 | 80 | 65 | 113 | 113 | 114 |
| S2 | 0 | 2 | 48 | 33 | 66 | 48 | 50 | 96 | 81 | 114 | 96 | 98 |
| S3 | 16 | 1 | 49 | 49 | 50 | 64 | 49 | 97 | 97 | 98 | 112 | 97 |
| S4 | 32 | 17 | 50 | 32 | 34 | 80 | 65 | 98 | 80 | 82 | 128 | 113 |
| S5 | 33 | 33 | 34 | 48 | 33 | 81 | 81 | 82 | 96 | 81 | 129 | 129 |
| S6 | 34 | 16 | 18 | 64 | 49 | 82 | 64 | 66 | 112 | 97 | 130 | 112 |

SIX PARTIAL SEQUENCE FACTORS

| | a1 | a2 | a3 | a4 | a5 | a6 | a7 | a8 | a9 | a10 | a11 | a12 | a13 |
|---|---|---|---|---|---|---|---|---|---|---|---|---|---|
| | 1 | 14 | -15 | 48 | 0 | 1 | 14 | -15 | 48 | 0 | 1 | 14 | -15 |
| | 2 | 46 | -15 | 33 | -18 | 2 | 14 | -15 | 33 | -18 | 2 | 46 | -15 |
| | | | -15 | 48 | 0 | 1 | 14 | -15 | 33 | -18 | 2 | 46 | -15 |
| | | | -15 | 33 | -18 | 2 | 46 | -15 | 33 | -18 | 2 | 46 | -15 |
| | | | | | 0 | 1 | 14 | -15 | 48 | 0 | 1 | 14 | |
| | | | | | -18 | 2 | 46 | -15 | 33 | -18 | 2 | 46 | |

PERIODICITY (P) = 5
NUMBER OF DIFFERENT PERIODS = 2

FIG. 4G

SEVEN PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 17 | 2 | 49 | 32 | 33 | 82 | 80 | 81 | 98 | 128 | 129 | 114 |
| S2 | 0 | 1 | 50 | 48 | 49 | 66 | 96 | 97 | 82 | 129 | 112 | 113 |
| S3 | 16 | 17 | 34 | 64 | 65 | 50 | 97 | 80 | 81 | 130 | 128 | 129 |
| S4 | 32 | 33 | 18 | 65 | 48 | 49 | 98 | 96 | 97 | 114 | 144 | 145 |
| S5 | 33 | 16 | 17 | 66 | 64 | 65 | 82 | 112 | 113 | 98 | 145 | 128 |
| S6 | 34 | 32 | 33 | 50 | 80 | 81 | 66 | 113 | 96 | 97 | 146 | 144 |
| S7 | 18 | 48 | 49 | 34 | 81 | 64 | 65 | 114 | 112 | 113 | 130 | 160 |

SEVEN PARTIAL SEQUENCE FACTORS

| a1 | a2 | a3 | a4 | a5 | a6 | a7 | a8 | a9 | a10 | a11 | a12 | a13 |
|---|---|---|---|---|---|---|---|---|---|---|---|---|
| -15 | 47 | -17 | 1 | 49 | -2 | 1 | 17 | 30 | 1 | -15 | 47 | -17 |
| | 1 | 49 | -2 | 1 | 17 | 30 | 1 | -15 | 47 | -17 | 1 | 49 | -2 |
| | | 1 | 17 | 30 | 1 | -15 | 47 | -17 | 1 | 49 | -2 | 1 | 17 | 30 |
| | | | 1 | -15 | 47 | -17 | 1 | 49 | -2 | 1 | 17 | 30 | 1 |
| | | | | -17 | 1 | 49 | -2 | 1 | 17 | 30 | 1 | -15 | 47 | -17 | 1 | 49 |
| | | | | | -2 | 1 | 17 | 30 | 1 | -15 | 47 | -17 | 1 | 49 | -2 | 1 | 17 |
| | | | | | | 30 | 1 | -15 | 47 | -17 | 1 | 49 | -2 | 1 | 17 | 30 | 1 | -15 |

PERIODICITY (P) = 10
NUMBER OF DIFFERENT PERIODS = 1

FIG. 4H

EIGHT PARTIAL SEQUENCES

|    | c1 | c2 | c3 | c4 | c5 | c6 | c7 | c8 | c9 | c10 | c11 | c12 |
|----|----|----|----|----|----|----|----|----|----|-----|-----|-----|
| S1 | 17 | 1  | 34 | 65 | 64 | 81 | 65 | 98 | 129 | 128 | 145 | 129 |
| S2 | 0  | 17 | 18 | 66 | 80 | 64 | 81 | 82 | 130 | 144 | 128 | 145 |
| S3 | 16 | 33 | 17 | 50 | 81 | 80 | 97 | 81 | 114 | 145 | 144 | 161 |
| S4 | 32 | 16 | 33 | 34 | 82 | 96 | 80 | 97 | 98  | 146 | 160 | 144 |
| S5 | 33 | 32 | 49 | 33 | 66 | 97 | 96 | 113 | 97 | 130 | 161 | 160 |
| S6 | 34 | 48 | 32 | 49 | 50 | 98 | 112 | 96 | 113 | 114 | 162 | 176 |
| S7 | 18 | 49 | 48 | 65 | 49 | 82 | 113 | 112 | 129 | 113 | 146 | 177 |
| S8 | 2  | 50 | 64 | 48 | 65 | 66 | 114 | 128 | 112 | 119 | 130 | 178 |

EIGHT PARTIAL SEQUENCE FACTORS

| a1 | a2 | a3 | a4 | a5 | a6 | a7 | a8 | a9 | a10 | a11 | a12 | a13 |
|----|----|----|----|----|----|----|----|----|-----|-----|-----|-----|
| −16 | 33 | 31 | −1 | 17 | −16 | 33 | 31 | −1 | 17 | −16 | 33 | 31 |
| 17 | 1 | 48 | 14 | −16 | 17 | 1 | 48 | 14 | −16 | 17 | 1 | 48 |
| −16 | 33 | 31 | −1 | 17 | −16 | 33 | 31 | −1 | 17 | −16 | 33 |    |
| −16 | 17 | 1 | 48 | 14 | −16 | 17 | 1 | 48 | 14 | −16 | 17 |    |
| −1 | 17 | −16 | 33 | 31 | −1 | 17 | −16 | 33 | 31 | −1 | 17 |    |
| 14 | −16 | 17 | 1 | 48 | 14 | −16 | 17 | 1 | 48 | 14 | −16 |    |
| 31 | −1 | 17 | −16 | 33 | 31 | −1 | 17 | −16 | 33 | 31 | 1 | 17 |
| 48 | 14 | −16 | 17 | 1 | 48 | 14 | −16 | 7 | 11 | 48 | 14 | −16 |

PERIODICITY (P) = 5
NUMBER OF DIFFERENT PERIODS = 2

FIG. 4I

NINE PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 17 | 17 | 17 | 34 | 66 | 98 | 113 | 128 | 128 | 161 | 161 |
| S2 | 0 | 33 | 33 | 33 | 50 | 82 | 114 | 129 | 144 | 144 | 144 | 177 |
| S3 | 16 | 16 | 49 | 49 | 49 | 66 | 98 | 130 | 145 | 160 | 160 | 160 |
| S4 | 32 | 32 | 32 | 65 | 65 | 65 | 82 | 114 | 146 | 161 | 176 | 176 |
| S5 | 33 | 48 | 48 | 48 | 81 | 81 | 81 | 98 | 130 | 162 | 177 | 192 |
| S6 | 34 | 49 | 64 | 64 | 64 | 97 | 97 | 97 | 114 | 146 | 178 | 193 |
| S7 | 18 | 50 | 65 | 80 | 80 | 80 | 113 | 113 | 113 | 130 | 162 | 194 |
| S8 | 2 | 34 | 66 | 81 | 96 | 96 | 96 | 129 | 129 | 129 | 146 | 178 |
| S9 | 1 | 18 | 50 | 82 | 97 | 112 | 112 | 112 | 145 | 145 | 145 | 162 |

NINE PARTIAL SEQUENCE FACTORS

| | a1 | a2 | a3 | a4 | a5 | a6 | a7 | a8 | a9 | a10 | a11 | a12 | a13 |
|---|---|---|---|---|---|---|---|---|---|---|---|---|---|
| S1 | 0 | 0 | 17 | 32 | 32 | 15 | 0 | 0 | 33 | 0 | 0 | 17 |
| S2 | 33 | 0 | 0 | 17 | 32 | 32 | 15 | 0 | 0 | 33 | 0 | 0 |
| S3 | 0 | 33 | 0 | 0 | 17 | 32 | 32 | 15 | 0 | 0 | 33 | 0 |
| S4 | 0 | 0 | 33 | 0 | 0 | 17 | 32 | 32 | 15 | 0 | 0 | 33 |
| S5 | 15 | 0 | 0 | 33 | 0 | 0 | 17 | 32 | 32 | 15 | 0 | 0 |
| S6 | 15 | 15 | 0 | 0 | 33 | 0 | 0 | 17 | 32 | 32 | 15 | 0 |
| S7 | 32 | 15 | 15 | 0 | 0 | 33 | 0 | 0 | 17 | 32 | 32 | 15 |
| S8 | 32 | 32 | 15 | 15 | 0 | 0 | 33 | 0 | 0 | 17 | 32 | 32 | 15 |
| S9 | 17 | 32 | 32 | 15 | 15 | 0 | 0 | 33 | 0 | 0 | 17 | 32 | 32 |

PERIODICITY (P) = 10
NUMBER OF DIFFERENT PERIODS = 1

FIG. 4J

TEN PARTIAL SEQUENCES

| | c1 | c2 | c3 | c4 | c5 | c6 | c7 | c8 | c9 | c10 | c11 | c12 |
|---|---|---|---|---|---|---|---|---|---|---|---|---|
| S1 | 17 | 33 | 49 | 65 | 81 | 97 | 113 | 129 | 145 | 161 | 177 | 193 |
| S2 | 0 | 16 | 32 | 48 | 64 | 80 | 96 | 112 | 128 | 144 | 160 | 176 |
| S3 | 16 | 32 | 48 | 64 | 80 | 96 | 112 | 128 | 144 | 160 | 176 | 192 |
| S4 | 32 | 48 | 64 | 80 | 96 | 112 | 128 | 144 | 160 | 176 | 192 | 208 |
| S5 | 33 | 49 | 65 | 81 | 97 | 113 | 129 | 145 | 161 | 177 | 193 | 209 |
| S6 | 34 | 50 | 66 | 82 | 98 | 114 | 130 | 146 | 162 | 178 | 194 | 210 |
| S7 | 18 | 34 | 50 | 66 | 82 | 98 | 114 | 130 | 146 | 162 | 178 | 194 |
| S8 | 2 | 18 | 34 | 50 | 66 | 82 | 98 | 114 | 130 | 146 | 162 | 178 |
| S9 | 1 | 17 | 33 | 49 | 65 | 81 | 97 | 113 | 129 | 145 | 161 | 177 |
| S10 | 17 | 33 | 49 | 65 | 81 | 97 | 113 | 129 | 145 | 161 | 177 | 193 |

TEN PARTIAL SEQUENCE FACTORS

| | a1 | a2 | a3 | a4 | a5 | a6 | a7 | a8 | a9 | a10 | a11 | a12 |
|---|---|---|---|---|---|---|---|---|---|---|---|---|
| | 16 | 16 | 16 | 16 | 16 | 16 | 16 | 16 | 16 | 16 | 16 | 16 |
| | 16 | 16 | 16 | 16 | 16 | 16 | 16 | 16 | 16 | 16 | 16 | 16 |
| | 16 | 16 | 16 | 16 | 16 | 16 | 16 | 16 | 16 | 16 | 16 | 16 |
| | 16 | 16 | 16 | 16 | 16 | 16 | 16 | 16 | 16 | 16 | 16 | 16 |
| | 16 | 16 | 16 | 16 | 16 | 16 | 16 | 16 | 16 | 16 | 16 | 16 |
| | 16 | 16 | 16 | 16 | 16 | 16 | 16 | 16 | 16 | 16 | 16 | 16 |
| | 16 | 16 | 16 | 16 | 16 | 16 | 16 | 16 | 16 | 16 | 16 | 16 |
| | 16 | 16 | 16 | 16 | 16 | 16 | 16 | 16 | 16 | 16 | 16 | 16 |
| | 16 | 16 | 16 | 16 | 16 | 16 | 16 | 16 | 16 | 16 | 16 | 16 |
| | 16 | 16 | 16 | 16 | 16 | 16 | 16 | 16 | 16 | 16 | 16 | 16 |

PERIODICITY (P) = 1
NUMBER OF DIFFERENT PERIODS = 1

FIG. 4K

OUTPUT SEQUENCE

| c1 | c2 | c3 | c4 | c5 | c6 | c7 | c8 | c9 | c10 | c11 | c12 |
|----|----|----|----|----|----|----|----|----|-----|-----|-----|
| 17 | 0  | 16 | 32 | 33 | 34 | 18 | 2  | 1  | 17  | 33  | 16  |

FACTOR

| a1  | a2 | a3 | a4 | a5 | a6 | a7  | a8  | a9 | a10 | a11 | a12 | a13 |
|-----|----|----|----|----|----|-----|-----|----|-----|-----|-----|-----|
| -17 | 16 | 16 | 1  | 1  | 1  | -16 | -16 | -1 | 16  | -16 | -17 | 16 16 |

PERIODICITY (P) = 10

THREE PARTIAL SEQUENCES

|    | c1 | c2 | c3 | c4 | c5 | c6 | c7 | c8 | c9 | c10 | c11 | c12 |
|----|----|----|----|----|----|----|----|----|----|-----|-----|-----|
| S1 | 17 | 32 | 18 | 2  | 33 | 50 | 17 | 32 | 65 | 34  | 65  | 80  |
| S2 | 0  | 33 | 2  | 33 | 48 | 34 | 33 | 48 | 66 | 33  | 48  | 81  |
| S3 | 16 | 34 | 1  | 16 | 49 | 18 | 49 | 64 | 50 | 49  | 64  | 82  |

THREE PARTIAL SEQUENCE FACTORS

| a1 | a2  | a3 | a4 | a5  | a6  | a7  | a8 | a9  | a10 | a11 | a12 | a13 |
|----|-----|----|----|-----|-----|-----|----|-----|-----|-----|-----|-----|
| 15 | -14 | -1 | 15 | 18  | -33 | 15  | 33 | -31 | 31  | 15  | -14 | -1  |
| 33 | -31 | 31 | 15 | -14 | -1  | 15  | 18 | -33 | 15  | 33  | -31 | 31  |
| 18 | -33 | 15 | 33 | -31 | 31  | 15  | -14| -1  | 15  | 18  | -33 | 15  |

PERIODICITY (P) = 10
NUMBER OF DIFFERENT PERIODS = 1

OUPUT SEQUENCE

| c1 | c2 | c3 | c4 | c5 | c6 | c7 | c8 | c9 | c10 | c11 | c12 |
|----|----|----|----|----|----|----|----|----|-----|-----|-----|
| 17 | 0  | 16 | 32 | 33 | 34 | 18 | 2  | 1  | 17  | 33  | 16  |

FACTOR

| a1  | a2 | a3 | a4 | a5 | a6  | a7 | a8 | a9 | a10 | a11 | a12 |
|-----|----|----|----|----|-----|----|----|----|-----|-----|-----|
| -17 | 16 | 16 | 1  | 1  | -16 | -16| -1 | 16 | 16  | -17 | 16  |

PERIODICITY (P) = 10

TEN PARTIAL SEQUENCES

|     | c1 | c2 | c3 | c4 | c5 | c6 | c7 | c8  | c9  | c10 | c11 | c12 |
|-----|----|----|----|----|----|----|----|-----|-----|-----|-----|-----|
| S1  | 17 | 33 | 49 | 65 | 81 | 97 | 113| 129 | 145 | 161 | 177 | 193 |
| S2  | 0  | 16 | 32 | 48 | 64 | 80 | 96 | 112 | 128 | 144 | 160 | 176 |
| S3  | 16 | 32 | 48 | 64 | 80 | 96 | 112| 128 | 144 | 160 | 176 | 192 |
| S4  | 32 | 48 | 64 | 80 | 96 | 112| 128| 144 | 160 | 176 | 192 | 208 |
| S5  | 33 | 49 | 65 | 81 | 97 | 113| 129| 145 | 161 | 177 | 193 | 209 |
| S6  | 34 | 50 | 66 | 82 | 98 | 114| 130| 146 | 162 | 178 | 194 | 210 |
| S7  | 18 | 34 | 50 | 66 | 82 | 98 | 114| 130 | 146 | 162 | 178 | 194 |
| S8  | 2  | 18 | 34 | 50 | 66 | 82 | 98 | 114 | 130 | 146 | 162 | 178 |
| S9  | 1  | 17 | 33 | 49 | 65 | 81 | 97 | 113 | 129 | 145 | 161 | 177 |
| S10 | 17 | 33 | 49 | 65 | 81 | 97 | 113| 129 | 145 | 161 | 177 | 193 |

TEN PARTIAL SEQUENCE FACTORS

|     | a1 | a2 | a3 | a4 | a5 | a6 | a7 | a8 | a9 | a10 | a11 | a12 |
|-----|----|----|----|----|----|----|----|----|----|-----|-----|-----|
|     | 16 | 16 | 16 | 16 | 16 | 16 | 16 | 16 | 16 | 16  | 16  | 16  |
|     | 16 | 16 | 16 | 16 | 16 | 16 | 16 | 16 | 16 | 16  | 16  | 16  |
|     | 16 | 16 | 16 | 16 | 16 | 16 | 16 | 16 | 16 | 16  | 16  | 16  |
|     | 16 | 16 | 16 | 16 | 16 | 16 | 16 | 16 | 16 | 16  | 16  | 16  |
|     | 16 | 16 | 16 | 16 | 16 | 16 | 16 | 16 | 16 | 16  | 16  | 16  |
|     | 16 | 16 | 16 | 16 | 16 | 16 | 16 | 16 | 16 | 16  | 16  | 16  |
|     | 16 | 16 | 16 | 16 | 16 | 16 | 16 | 16 | 16 | 16  | 16  | 16  |
|     | 16 | 16 | 16 | 16 | 16 | 16 | 16 | 16 | 16 | 16  | 16  | 16  |
|     | 16 | 16 | 16 | 16 | 16 | 16 | 16 | 16 | 16 | 16  | 16  | 16  |
|     | 16 | 16 | 16 | 16 | 16 | 16 | 16 | 16 | 16 | 16  | 16  | 16  |

PERIODICITY (P) = 10
NUMBER OF DIFFERENT PERIODS = 1

PROGRAM
STEPS

OUTPUT SEQUENCE   C1;  C2;  C3;  C4;  C5;  C6;  C7;  C8;  C9;
                  2;   4;   1;   3;   6;   1.5; 4.5; 9;   2.25;....  PERIODICITY (P) = 3

FACTOR              x2;  ÷4;  x3;  x2;  ÷4;  x3;  x2;  ÷4;

A1;  A2;  A3;  A4;  A5;  A6;  A7;  A8;

C1 = C1 x 2
C3 = C2 ÷ 4
C4 = C3 x 3
C5 = C4 x 2
C6 = C5 ÷ 4
C7 = C6 x 3
      C1

THREE PARTIAL SEQUENCES c1   c2   c3   etc.
S1   2    3    4.5
S2   4    6    9
S3   1    1.5  2.25

THREE PARTIAL SEQUENCES FACTORS a1    a2    a3    etc.
     x1.5  x1.5  x1.5
     x1.5  x1.5  x1.5       n = 2, 3, 4, 5, ...
     x1.5  x1.5  x1.5

$c_n = c_{n+1} \times (2 \div 3 \times 3) - \times 1.5$

FIG. 7

| OUTPUT SEQUENCE | C1 | C2 | C3 | C4 | C5 | C6 |
|---|---|---|---|---|---|---|
| | 1.000 | 3.313 | 2.978 | 1.091 | 3.386 | 3.466 |

| FACTOR | A1; | A2; | A3; | A4; | A5; |
|---|---|---|---|---|---|
| | $(C1+\pi) \times 0.8$; | $(C2^2-8)$; | $\ln(C3)$; | $(C4+\pi) \times 0.8$; | $C5^2-8$; |

PERIODICITY (P) = 3

$C2 = (C1 + \pi) \times 0.8$
$C3 = (C2^2 - 8)$
$C4 = \ln(C3)$
$C5 = (C4 + \pi) \times 0.8$
$C6 = (C5^2 - 8)$
etc.

THREE PARTIAL SEQUENCES

| | c1 | c2 | etc. |
|---|---|---|---|
| S1 | 1.000; | 1.091; | |
| S2 | 3.313; | 3.386; | |
| S3 | 2.978; | 3.466; | |

THREE PARTIAL SEQUENCES FACTORS $c_n = \ln \left[ \{(c_{n-1} + \pi) \times 0.8\}^2 - 8 \right]$    $n = 2, 3, 4, 5, \ldots$ $c_n = \left[ \ln (c_{n-1}^2 - 8) + \pi \right] \times 0.8$    $n = 2, 3, 4, 5, \ldots$ $c_n = \{ (\ln c_{n-1} + \pi) \times 0.8 \}^2 - 8$    $n = 2, 3, 4, 5, \ldots$

FIG. 8

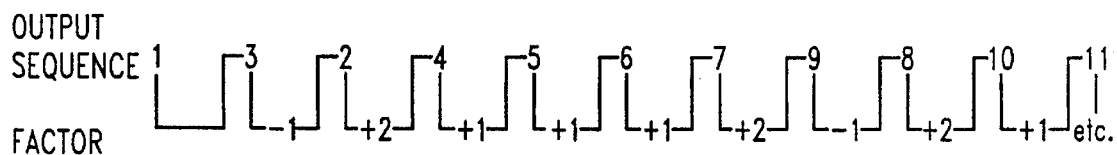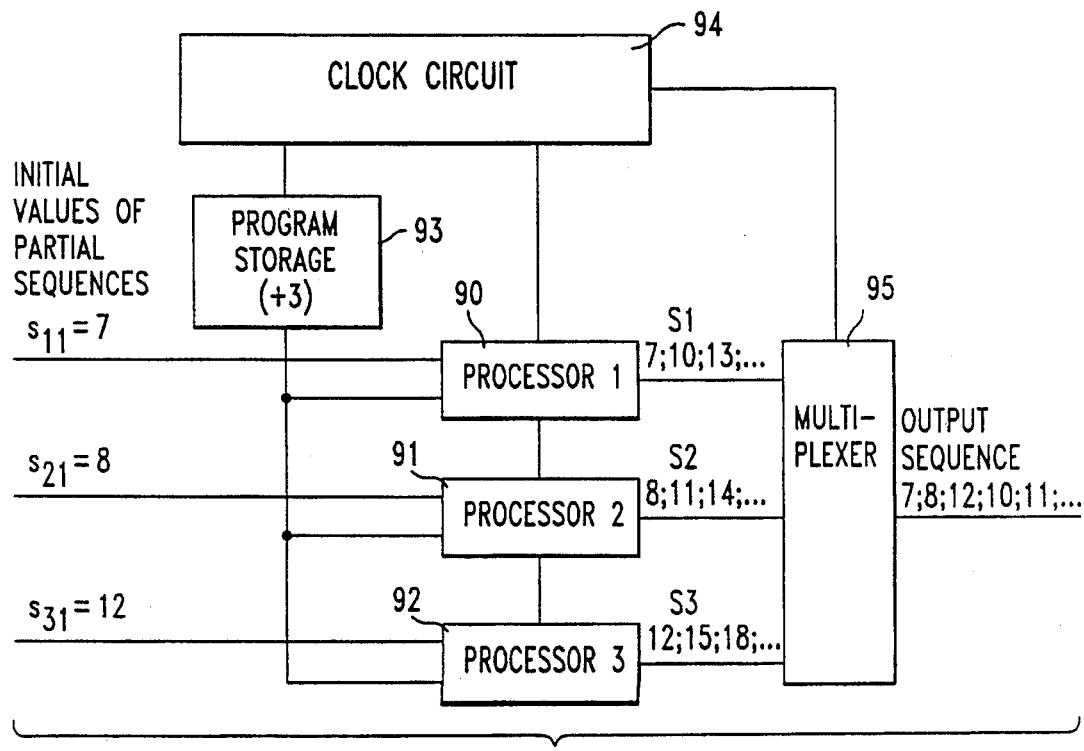
FIG. 11

CIRCUIT FOR GENERATING AN OUTPUT SEQUENCE OF VALUES

BACKGROUND OF THE INVENTION

1. Field of the Invention

The invention relates to a circuit for generating an output sequence of values and to a method and an arrangement for optimizing such a circuit.

2. Description of the Prior Art

Memory components and logic circuits undergo continual improvement. Especially evident is the trend toward increasingly greater memory capacity and faster clock frequencies for memory read and write operations. The manufacture of such chips is extremely expensive and complex. The slightest impurities and other influences during the manufacturing process can cause the chip to later become error-prone or even completely inoperative. For this reason, chips are tested after manufacture, before they are released for actual application. Such tests prescribe that the individual chip memory cells be addressed for write and read operations in a specific sequence or test address pattern. If the operation of the memory cells is error-free, the test leads to the expected results. If the test results deviate, however, this is an indication that a defect exists. Such defects can of course be analyzed to determine their cause.

Which cells are exercised in which order is determined by the aforementioned test address pattern. For high-speed memory components, the individual memory cells should be addressed with the fastest sequence possible. This requires test systems which are capable of issuing consecutive values in the address sequences in the shortest possible time. This requirement for speed has natural limits, which are set by the circuits themselves and the circuit technology.

The fastest technology in today's integrated circuits is based on the gallium arsenide technology, which permits an extremely fast charge carrier movement. In addition, special circuit designs can enable "fast" address sequences to be generated. Circuits that are presently available for generating such fast address sequences are expensive, complex and limited in their capabilities.

It is thus desirable that a simple inexpensive circuit be designed that can interleave a variety of sequences, which means the following: rather than the impossible generation of a fast output sequence of (address) values:

C1 C2 C3 C4 C5 etc.

slower partial sequences

|     | C1 | C3 | C5, | etc. |
| --- | --- | --- | --- | --- |
| and |    |    |     |      |
|     | C2 | C4 | C6  | etc. | can be generated and then recombined with a multiplexer into the required fast output sequence:

C1; C2; C3; C4; C5; etc.

SUMMARY OF THE INVENTION

If output sequences which have a period are divided into a number of partial sequences corresponding to the number of values in the period P of the output sequence, the values of all the partial sequences are identical and can form a constant, or other mathematically expressible term but if the output sequences are divided into a number of partial sequences whose number is <P, at least one partial sequence set, with a given number of partial sequences, will exhibit the same, multi valued period.

Mathematically the relationship of a sequence C1; C2; C3; C4; C5; etc. can be expressed as:

C2=C1 in combination with A1

C3=C2 in combination with A2

C4=C3 in combination with A3 when A1, A2, etc. are a sequence of mathematical factors or operators such as summands, subtrahends, multipliers, divisors or logarithms etc.

In this manner, the value of each element C1, C2, C3 etc. in the sequence can be formed by the adding of the value of the preceding element and the corresponding value in the factor sequence A1, A2, A3, etc. By doing so, as will be explained in the specific embodiment set forth below, surprising circuit simplifications not found in the prior art can be realized.

In the circuits of the present invention, each partial sequence is generated by a processor and all partial sequences are recombined by a multiplexer into the desired output sequence.

In one case, all processors need only a single, simple common program storage means, which for example need provide only a constant factor or a mathematical expressible term to the generated partial sequences.

In another case for all processors, a single common program storage means is required for the various values of the partial sequence period, such as might consist of concatenated registers, can be connected to the processor in such a way that even a mutual shift of the partial sequence period in the individual partial sequence is taken into consideration.

The invention, from an output sequence, determines; the period of the output sequence, the partial sequence initial values, and the partial sequence constant or a mathematically expressible term. From these values a circuit can be configured that generates the partial sequences and combines them into the desired output sequence or determines the initial values of the partial sequences with a common period a circuit for producing the output sequence.

The invention is thus directed to teaching how to design a simple inexpensive circuit for fast interleaving of pulse sequences by analyzing the desired output sequence of values to be created and arranging this output sequence in partial sequences determined by their periodicity. The circuit designed by this approach needs only a single program storage means to control any number of processors each of which contains only a single respective value and that these processors need be only simple arithmetic and logic units (ALUs).

It is an object of the invention to provide a method and an arrangement for optimizing a circuit for generating an output sequence of values.

It is a further object of the invention to provide speed-enhancing circuit improvements in circuit elements working with carries and especially to circuit improvements in arithmetic and logic units and in counters.

The invention is described in greater detail in the following discussion taken in conjunction with the accompanying drawing wherein:

DESCRIPTION OF THE DRAWINGS

FIG. 1A graphically depicts a sample rudimentary output sequence in conjunction with a periodic factor;

FIG. 1B is a simplified depiction of FIG. 1A;

FIG. 1C represents six partial sequences associated with six processors for a given period P=6 of the output sequence of FIG. 1A;

FIG. 3A graphically depicts an example of a test address sequence;

FIG. 3B shows a test address sequence of FIG. 3A, in sequential representation, in conjunction with a periodic factor;

FIG. 3C shows two partial sequences and the associated factors for the test address sequence of FIG. 3B;

FIG. 3D shows three partial sequences and the associated factors for the test address sequence of FIG. 3B;

FIG. 3E shows four partial sequences and the associated factors for the test address sequence of FIG. 3B;

FIG. 3F shows five partial sequences and the associated factors for the test address sequence of FIG. 3B;

FIG. 3G shows six partial sequences and the associated factors for the test address sequence of FIG. 3B;

FIG. 3H shows seven partial sequences and the associated factors for the test address sequence of FIG. 3B;

FIG. 3I shows eight partial sequences and the associated factors for the test address sequence of FIG. 3B;

FIG. 3J shows nine partial sequences and the associated factors for the test address sequence of FIG. 3B;

FIG. 3K shows ten partial sequences and the associated factors for the test address sequence of FIG. 3B;

FIG. 4A graphically depicts an example II of a test address sequence;

FIG. 4B is a test address sequence of FIG. 4A, in sequential representation, in conjunction with a periodic factor;

FIG. 4C shows two partial sequences and the associated factors for the test address sequence of FIG. 4B;

FIG. 4D shows three partial sequences and the associated factors for the test address sequence of FIG. 4B;

FIG. 4E shows four partial sequences and the associated factors for the test address sequence of FIG. 4B;

FIG. 4F shows five partial sequences and the associated factors for the test address sequence of FIG. 4B;

FIG. 4G shows six partial sequences and the associated factors for the test address sequence of FIG. 4B;

FIG. 4H shows seven partial sequences and the associated factors for the test address sequence of FIG. 4B;

FIG. 4I shows eight partial sequences and the associated factors for the test address sequence of FIG. 4B;

FIG. 4J shows nine partial sequences and the associated factors for the test address sequence of FIG. 4B;

FIG. 4K shows ten partial sequences and the associated factors for the test address sequence of FIG. 4B;

FIG. 5A shows the output sequence of FIG. 4B in conjunction with a periodic factor and the three partial sequences (FIG. 4D) derived from the output sequence, with corresponding factors;

FIG. 6A shows the output sequence of FIG. 4B in conjunction with a periodic factor and the ten partial sequences (FIG. 4K) derived from the output sequence, with associated factors.

FIG. 7 shows an output sequence with a periodic factor whose values represent multipliers or divisors, and a grouping of the output sequence in three partial sequences with associated three partial sequence factors;

FIG. 8 shows an output sequence with a periodic factor, whose values represent complex (subroutine-like) arithmetic operations, and a grouping of the output sequence in three partial sequences with associated three partial sequence factors;

FIG. 11 is a simplified representation of a further output sequence example with an factor period of three values in conjunction with three partial sequences with an factor constant K=3, and a representation of a circuit comprising three processors for generating the three partial sequences and the output sequence.

Figure 1D:
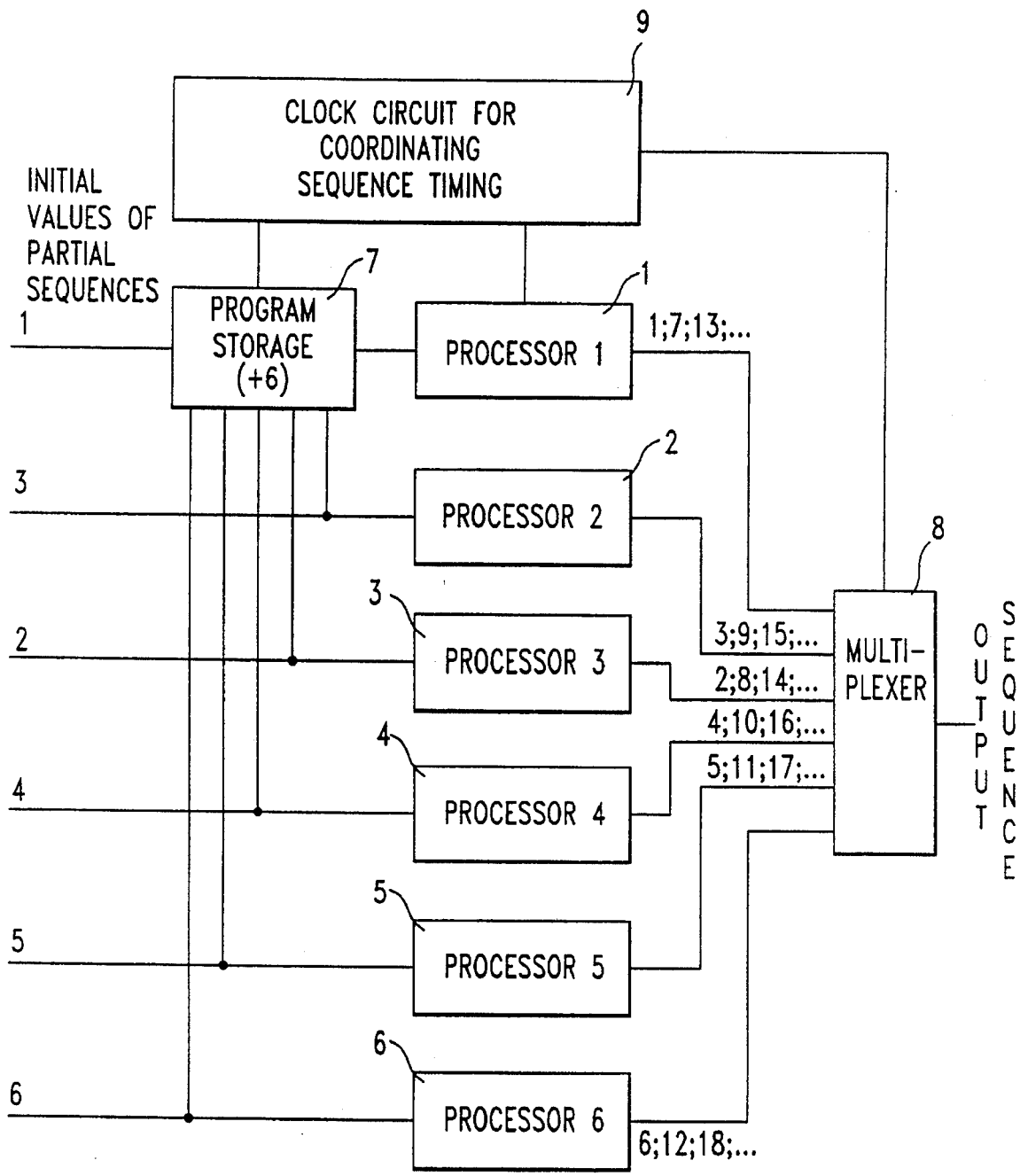
FIG. 1D is a schematic of six processors for producing the six partial sequences of FIG. 1C using a single program storage means, FIG. 2A graphically represents the output sequence of FIG. 1A in conjunction with the periodic factor.

In memory chips undergoing testing, the memory cells are addressed in a predetermined address sequence, and appropriate pulses are applied to them. The predetermined address sequence for exhaustive testing of memory chips is based on certain test patterns and will be described later in conjunction with FIG. 3A and FIG. 4A. As will be described, in the present invention the generation of such an output sequence or address sequence can take place with the aid of an factor.

FIG. 1A shows a graphic representation of an example of a simple output sequence in conjunction with a periodic factor. In the upper portion of the figure, the consecutive values of the output sequence are indicated:

1; 3; 2; 4; 5; 6; 7; 9; 8; 10; 11, etc.

With the aid of the factor:

+2; −1; +2; +1; +1; +1; +2; −1; +2; +1; etc.

the next value can be determined from a given value of the output sequence. In the current example the second value 3 is formed from the first value 1 by adding +2 (first value of the factor). The third value 2 of the output sequence is formed by adding −1 (second value of the factor) to the preceding value 3 of the output sequence.

In this manner, given the factor and the initial value of the output sequence, the individual values of the output sequence can be determined.

In the depiction of FIG. 1A, the addition values constituting the factor are shown staggered below the corresponding output sequence values. The combination of output sequence values and factor values is indicated by connecting lines: an output sequence value is added to the corresponding factor value and the result of this addition supplies the new output sequence value.

FIG. 1B shows a simplified representation of FIG. 1A. The values of the output sequence are shown consecutively, separated by semicolons; underneath is the factor, whose values are shown staggered with respect to the associated output sequence values.

It is evident that a certain sequence of factor values, here

+2; −1; +2; +1; +1; +1 recurs periodically. The periodicity of the factor is given as (P)=6, whereby the six means that the period comprises six values. This "factor period" is indicated by a horizontal bracket.

FIG. 1C shows the six partial sequences derived from the output sequence (FIG. 1A), as associated with processors 1 through 6. The number six corresponds to the periodicity (P)=6 of the factors in the output sequence.

The partial sequences represent subsets of the output sequence, from which the output sequence can be reconstructed. The term "interleave" is used here to mean the cyclical breakup or division of the output sequence into partial sequences (interleave sequences). Assuming that six partial sequences are to be formed from the output sequence, the first partial sequence would be formed from the 1st, 7th, 13th, 19th, . . . th value of the output sequence, the second partial sequence from the 2nd, 8th, 14th, 20th, . . . th value of the output sequence, etc., and the sixth partial sequence from the 6th, 12th, 18th, 24th, . . . th value of the output sequence.

It is clear that the output sequence can be reconstructed from the six partial sequences as follows:

```
1st value of 1st partial sequence
1st value of 2nd partial sequence
1st value of 3rd partial sequence
etc.
2nd value of 1st partial sequence
2nd value of 2nd partial sequence
2nd value of 3rd partial sequence
etc.
```

For a periodicity (P)=6 of the factor of the output sequence, as shown in FIG. 1B, it is surprising that for six partial sequences (a six-fold interleave) the values for the partial sequences are derived by successive addition of the value A=6 to the initial values of the partial sequences.

In this manner, each of the processors 1 through 6 produces the respective partial sequence:

```
1 (1st value of 1st partial sequence) + 6 = 7 (2nd value
    of 1st partial sequence)
7 (2nd value of 1st partial sequence) + 6 = 13 (3rd value
    of 1st partial sequence)
etc.
3 (1st value of 2nd partial sequence) + 6 = 9 (2nd value
    of 2nd partial sequence)
9 (2nd value of 2nd partial sequence) + 6 = 15 (3rd value
    of 2nd partial sequence)
etc.
Thus,
```

```
processor 1 generates the 1st partial sequence 1; 7; etc.
processor 2 generates the 2nd partial sequence 3; 9; etc.
processor 3 generates the 3rd partial sequence 2; 8; etc.
processor 4 generates the 4th partial sequence 4; 10;
etc.
processor 5 generates the 5th partial sequence 5; 11;
etc.
processor 6 generates the 6th partial sequence 6; 12;
etc.
```

FIG. 1D shows a schematic of six processors 1–6 for producing the six partial sequences of FIG. 1C with a single program storage means 7.

The task of the processors 1 through 6, i.e., generating the first through sixth partial sequences, respectively, was previously described in conjunction with FIG. 1C and need not be repeated here.

Each processor receives the initial value of the respective partial sequence and this value appears at the output of the processor at the start of the partial sequence to be generated. To this value is added, in a second step, the value A=+6, stored in program storage means 7: in this manner, the second value of each of the partial sequences is formed. In the following step, A=+6 is again added to the previously formed second value of the partial sequence, producing the third value of the partial sequence, etc. The partial sequence generated by processor 1:

1; 7; 13; etc.

is combined with the partial sequences generated by processors 2, 3, 4, 5, 6

(3; 9; 15; etc./2; 8; 14; etc./4; 10, 16; etc./5; 11; 17; etc./6; 12, 18; etc.)

in the previously explained manner by multiplexer 8 into the required output sequence:

1; 3; 2; 4; 5; 6; 7; 9; 8; 10; 11; etc.

The timing of the sequences is coordinated by clock circuit 9, which is connected to program storage means 7, processors 1 through 6, and multiplexer 8.

Figures 2A, 2B, 2C:
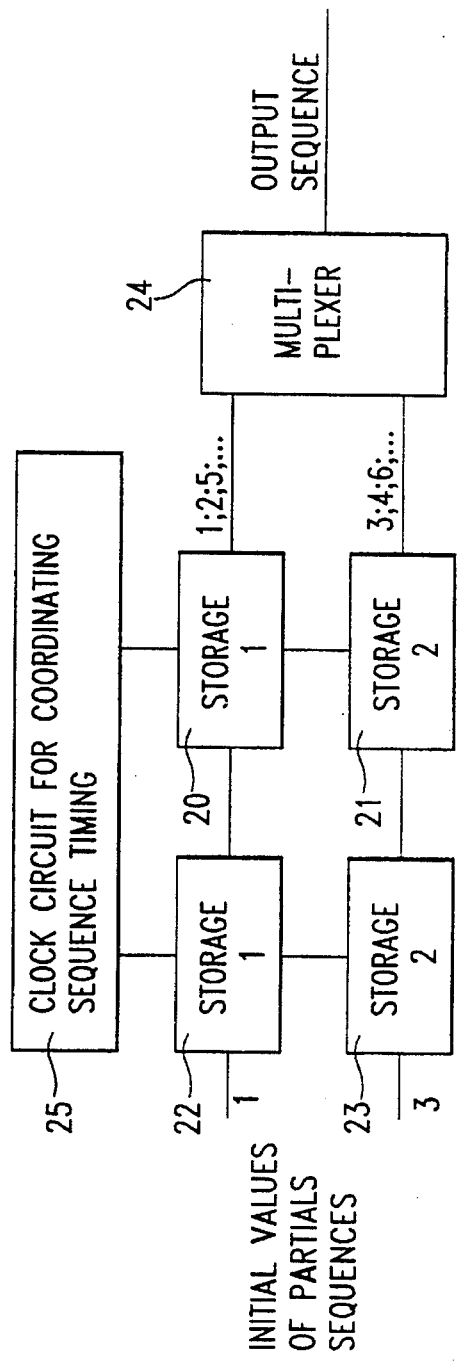
FIG. 2B graphically depicts two partial sequences derived from the output sequence of FIG. 2A in conjunction with the factors for these partial sequences.
FIG. 2C shows a simplified block schematic of a state-of-the-art circuit for producing two partial sequences with two processors, each with a program storage means for the factor of a partial sequence.

In FIGS. 1A, 1B, 1C, and 1D, a simple embodiment of the invention has been described. A required output sequence with a corresponding factor having a certain periodicity, here (P)=6, is broken into a number of partial sequences determined by the periodicity. For such a case, i.e., periodicity= number of partial sequences, each of the partial sequences can be generated from the initial values of the partial sequences by cumulative addition of a constant, in this case A=+6. In addition to a number of processors equal to the periodicity, only one program storage means is required here (for storing the value A=+6), to which all processors have access. Thus the need of processor specific program storage means, as shown in FIG. 2C, are no longer required. Via a multiplexer 8, the individual partial sequences generated by the processors are combined into the required output sequence.

By dividing the necessary output sequence into a certain number of partial sequences, corresponding to the periodicity of the factor of the output sequence, an extremely simple and effective circuit needing only one program storage means, as shown in FIG. 1D, is produced.

FIGS. 2A, 2B, and 2C, illustrate the state of the art. In FIG. 2A there is shown a required output sequence 1; 3; 2; 4; 5; 6; 7; 9; 8; 10; 11; etc.

with a corresponding factor

+2; −1; +2; +1; +1; +1; +2; −1; +2; +1; etc.

If these are separated into two partial sequences: the first partial sequence, as shown in FIG. 2B, is 1; 2; 5; 7; 8; 11; etc.

with the associated factor being

+1; +3; +2; +1; +3; etc.

and the second partial sequence is

3; 4; 6; 9; 10; 12; etc.

with the associated partial sequence being

+1; +2; +3; +1; +2; etc.

From FIG. 2A, it can be seen that the factor period for the output sequence comprises six values, corresponding to the number of values framed by the bracket. If, for this periodicity (P)=6, six partial sequences as for the examples in FIG. 1 were formed the significant advantages of the present invention would have been realized. However the prior art failed to do so and as will be further discussed below in conjunction with FIG. 2C instead formed only two partial sequences. The prior art did so because it required fewer processors but required multiple program storage means, i.e., one for each processor. Thus although the number of processors is lower no advantage is realized for program storage means are extremely complex while the processors needed, when the teachings of the present invention are used, are simple arithmetic and logic units (ALUs). Thus the present invention teaches that comparatively simple and less expensive and complex circuits can be created that avoid the difficulties of the prior art circuits.

In FIG. 2C, a simplified block schematic of a circuit is shown which generates both partial sequences. The first partial sequence is generated by processor 20, the second by processor 21. For the generation of each partial sequence, its initial value and the period of the partial sequence factor is predetermined and stored respectively in program storage means 22, 23.

Thus program storage means 22 contains the period "(+1); ((+3)); (((+2)))" as shown in the first partial sequence shown in FIG. 2B. Similarly, the period "+1, +2; +3" of the second partial sequence is contained in program storage means 23.

To generate the first partial sequence by processor 20, the following operations, familiar from previous examples, are carried out:

| | |
|---|---|
| 1 = | 1 (initial value) |
| 1 + (+1) = | 2 |
| 2 + ((+3)) = | 5 |
| 5 + (((+2))) = | 7 |
| 7 + (+1) = | 8 |
| etc. | |

The generation of the second partial sequence by processor 21 is similar. Each value of the partial sequence is formed by adding the previous value to the cyclically progressing value of the partial sequence factor.

At the outputs of processor 20 and processor 21, the first and second partial sequences, respectively, are available, which are combined via multiplexer 24 into the required output sequence. The coordination of the sequence timing is determined by clock circuit 25, which is connected to program storage means 22, 23, processors 20, 21, and multiplexer 24.

From this example (FIG. 2C), it can be seen that the prior art circuit for generating the required output sequence is far more complex than the circuit of the present invention as shown in FIG. 1D. As mentioned previously this prior art circuit requires multiple program storage means, i.e., one for each processor with each program storage means containing not a single value but rather a series of values, i.e., the partial sequence. Compared to the circuit of the FIG. 1D, the number of processors is lower, but this is not an advantage, since the program storage means are extremely complex for these must contain a multiple of values.

The present inventor realized that fast interleaving could be accomplished by a circuit which needed only a single program storage means to control any number of processors each of which contained only a single respective value and that these processors need be only simple arithmetic and logic units (ALUs) if the output sequence of values to be created were analyzed and arranged in partial sequences determined by their periodicity.

FIG. 3A shows an address pattern of a chip. On the basis of a predetermined test pattern in the heavy-bordered areas in conjunction with the arrow sequences, a certain output sequence of addresses is to be generated. In FIG. 3A, the chip addresses are arranged sequentially by columns: 0; 1; 2; 3; etc. The test pattern to be applied in this case supports the address sequence

0; 1; 2; 3; 64; 65; 66; 67 which, after shifting of the pattern in the next step by a total of four positions further down, is continued with 4; 5; 6; 7; 68; 69; 70; 71; etc.

The arrows in the test pattern indicates the address sequence.

As soon as the first column addresses 0 through 15 has been "worked off" by the test pattern, the test pattern is shifted to the start of the second column. In this manner, the output sequence of FIG. 3B is generated, with the associated factor periodicity of (P)=8. The output sequence values are shown generally in the first box of FIG. 3B as C1 through C12, and the factor values for the output sequence are shown in the second box as A1 through A12. The sequence of C and A values of course continues. In the following figures (FIGS. 3C through 3K), the output sequence with associated factor is divided into various numbers of partial sequences with associated partial sequence factors.

Thus, FIG. 3C shows a grouping in two partial sequences S1 and S2, whose values are indicated generally as c1 through c12. Additionally, the corresponding values of the two partial sequence factors are indicated as a1 through a13. The sequence of c and a values also continues, of course. This is also true for all subsequent illustrations. The relationships between the two partial sequences and the two partial sequence factors can be understood as follows: for S1 and the associated factor, or for S2 and the associated factor, the following is true:

c1+a1=c2 c2+a2=c3 c3+a3=c4 etc.

Similar relationships hold true for all subsequent illustrations.

Thus, from one value of the partial sequence, the next value is formed by adding the associated factor value.

In the two partial sequences, the periodicity of the sequence

2; 62; 2; −62 as shown in the boxed area of FIG. 3C applies. This means that the two partial sequences can be formed from the initial value with the help of these periodicity values of the partial sequence factor. In the illustration of FIG. 3C, the periodicity for the partial sequences with (P)=4 is shown; i.e., the period consists of four values. The number of different periods is indicated as 1, i.e., there is a single factor period for the partial sequences S1 and S2, namely:

2; 62; 2; −62

FIG. 3D shows the grouping of the output sequence of FIG. 3B in three partial sequences S1, S2, and S3, with the associated three partial sequence factors. For these three partial sequence factors, the periodicity is (P)=8, as shown in the boxed areas. The period values in the individual partial sequence factors are shifted 5 positions with respect to each other. Since the period is the same in all three partial sequence factors, the number of different periods is again 1.

In FIG. 3E, the grouping of the output sequence of FIG. 3B is shown in four partial sequences S1, S2, S3, S4, with the associated four partial sequence factors. Inspection of this factor reveals a periodicity of (P)=2 for the respective boxed values 64 and −60. This period 64 and −60 occurs in all four partial sequence factors without mutual shift. The number of different periods is again 1.

FIG. 3F shows the grouping of the output sequence of FIG. 3B in five partial sequences S1 through S5 with the associated five partial sequence factors. The individual factors are denoted by the same period sequence:

65; −59; 65; 1; −59; 65; 59; 1 as shown in the boxed areas.

This period sequence is shifted by 3 positions from one factor to the next. Corresponding to the period of eight values, the periodicity is (P)=8. Because the period in all factors is identical, the number of different periods is again 1.

FIG. 3G shows the grouping of the output sequence of FIG. 3B in six partial sequences S1 through S6 and the associated six partial sequence factors. The period is again boxed in each case. The periodicity is (P)=4, and the number of different periods is 1.

FIG. 3H shows the grouping of the output sequence of FIG. 3B in seven partial sequences S1 through S7 and the associated seven partial sequence factors. As can be seen in FIG. 3A, the same 8-valued period (boxed) occurs in all seven partial sequences, shifted by one position from one factor to the next. The periodicity is (P)=8, and the number of different periods=1.

FIG. 3I shows the grouping of the output sequence of FIG. 3B with periodicity (P)=8 in eight partial sequences S1 through S8. This figure shows the property exhibited when the number of partial sequences equals the periodicity (here (P)=8) of the output sequence. As previously mentioned, this characteristic is that the period of all partial sequence factors consists of a single value (periodicity (P)=1) and that this value is a constant (here 4). This characteristic enables the circuit simplifications described in conjunction with FIGS. 1C and 6A.

In FIG. 3J, investigation of the grouping of the output sequence in higher numbers of partial sequences is continued. FIG. 3J shows the grouping in nine partial sequences S1 through S9 with associated nine partial sequence factors. For these factors, the periodicity is (P)=8 and the number of different periods=1.

In FIG. 3K, the grouping of the output sequence of FIG. 3B in ten partial sequences S1 through S10 with associated ten partial sequence factors is shown. The periods of the factors comprise the values: 6; 66; 6; −58 (boxed). The periodicity is (P)=4 and the number of different periods=1. The mutual shift of the period in the factors in the individual partial sequences is apparent from the illustration.

The values listed in FIGS. 3C through 3K under the partial sequence factors, periodicity (P) and number of different periods, provide an indication of the complexity of the circuit for producing the output sequence from the partial sequences generated by processors. Basically, the number of partial sequences determines the number of processors required, and the number of different periods, as indicated by FIG. 2, determines the number of required program storage means, whereby the periodicity determines the complexity of the program storage means.

If the periodicity (P)=1, i.e., the period comprises only one and not multiple values, there is a considerable simplification of the program storage means, which in this case must provide only one value, i.e., a constant, in order for the partial sequences to be generated by processors from the initial values of the individual partial sequences and this constant.

The constant 4, shown in FIG. 3I for all eight partial sequences, can also be determined from the sum of all positive and negative values of the output sequence factor period (+1; +1; +1; +61; +1; +1; +1; −63).

This rule will also be encountered below, in conjunction with FIGS. 7 and 8, when the values of the output sequence factor period no longer represent simple positive or negative numbers but rather complex arithmetic expressions.

Figure 4A:
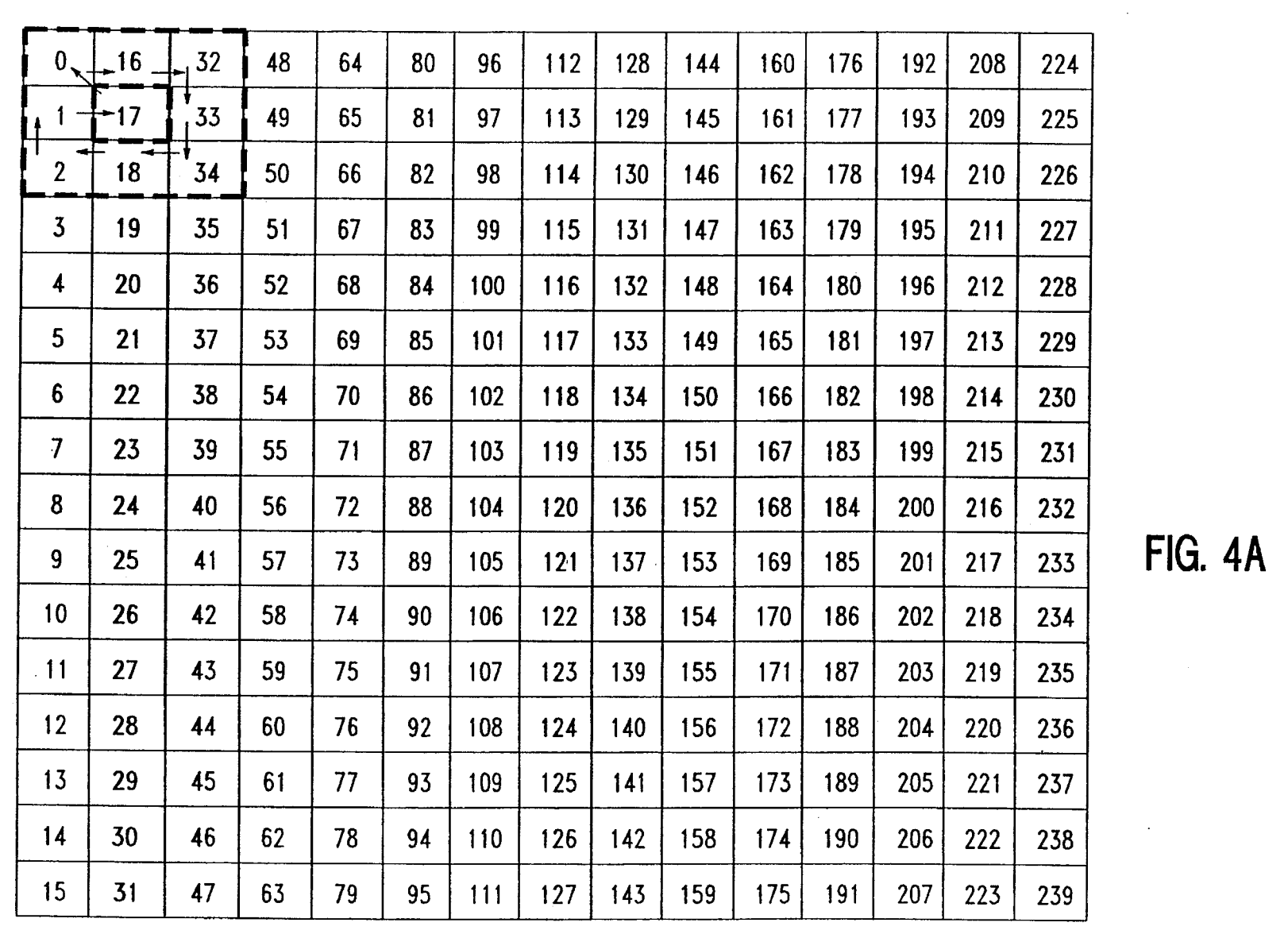

FIG. 4A graphically depicts another example of a chip address test pattern. The chip addresses are arranged sequentially in columns. The arrow sequence in the test pattern indicates the following address sequence:

17; 0; 16; 32; 33; 34; 18; 2; 1; 17

In a following step, the test pattern is shifted by one position to the right, so that the address sequence is continued with 33; 16; 32; 48; 49; 50; 34; 18; 17, etc.

followed by further, line-oriented application of the test pattern to the chip addresses.

The address sequence resulting from application of the test pattern is denoted in FIG. 4B as the output sequence and represented sequentially. Underneath, the factor for the output sequence is given. The individual factor values are shown staggered with respect to the values of the output sequence. As in the preceding observations, the output sequence can be derived from the initial value of the output sequence and the factor values. The factor indicates a periodicity (P)=10, shown by a horizontal bracket. Since there is for the output sequence only one and not different periods, the number of different periods=1. In the lower portion of the illustration of FIG. 4B, the output sequence and the factor are shown in a different context, whereby the values of the output sequence are further denoted as C1 through C12 and the values of the factor as A1 through A12 as shown in the boxed areas.

The illustration in FIG. 4C shows a grouping of the output sequence in FIG. 4B in two partial sequences S1 and S2 with the associated two partial sequence factors. The partial sequence factors in FIG. 4C each indicate, as shown by the bordered area, a five-value periodicity: (P)=5. Since the periods in both partial sequences are different, the number of different periods=2, FIG. 4D shows a grouping of the output sequence of FIG. 4B in three partial sequences with the associated three partial sequence factors. The periods of these factors are identical, even though they are shifted with respect to one another. They show a periodicity (P)=10. Due to the identity of the periods, the number of different periods=1.

FIG. 4E shows a grouping of the output sequence of FIG. 4B in four partial sequences with the associated four partial sequence factors. There are two different factor periods, with periodicity (P)=5. The number of different periods is 2.

FIG. 4F shows a grouping of the output sequence of FIG. 4B in five partial sequences with the associated five partial sequence factors. Inspection of these factors shows that a total of five different periods occur and that the factors are each denoted by a two-valued period (periodicity (P)=2).

FIG. 4G shows a grouping of the output sequence of FIG. 4B in six partial sequences with the associated six partial sequence factors. Inspection of these factors shows that two different periods occur, even though in the partial sequences there are sometimes periods shifted with respect to each other (bordered), and that each period has five values (periodicity (P)=5).

FIG. 4H shows a grouping of the output sequence of FIG. 4B in seven partial sequences with the associated seven partial sequence factors. The periods of the factors are identical, even though they are mutually shifted (number of different periods=1). As shown by the boxed areas, they indicate a periodicity with ten values, (P)=10.

FIG. 4I shows a grouping of the output sequence of FIG. 4B in eight partial sequences with the associated eight partial sequence factors. Inspection of these factors shows that two different periods occur (number of different periods=2), even though they are mutually shifted, as shown by the boxed areas, and that each period has five values (periodicity (P)=5).

FIG. 4J shows a grouping of the output sequence of FIG. 4B in nine partial sequences S1 through S9 with the associated nine partial sequence factors. The periods of factors are identical, even though they are mutually shifted (number of different periods=1). The periods (boxed) comprise ten values (periodicity (P)=10).

FIG. 4K shows a grouping of the output sequence of FIG. 4B in ten partial sequences with the associated ten partial sequence factors. In this illustration, in which the number of partial sequences equals the periodicity (P)=10 of the factor of the output sequence of FIG. 4B, the property noted for FIG. 1C is exhibited, that the period of the ten partial sequences consists of a single value (here 16). Thus, the number of different periods=1 and the periodicity (P)=1.

On the basis of the example of the output sequence indicated in FIG. 4B in conjunction with the grouping in three partial sequences shown in FIG. 4D, FIGS. 5A, 5B, and 5C illustrate how the three partial sequences can be generated with the aid of a processor 51 (FIG. 5B) containing multiple arithmetic and logic units (ALUs) 54–56 and single program storage means 59–68.

As indicated in FIG. 5A, the output sequence is

17; 0; 16; 32; 33; 34; 18; 2; 1; 17; 33; 16; etc.

The individual values are denoted by C1 through C12.
The factor for the output sequence is:

−17; 16; 16; 1; 1; −16; −16; −1; 16; 16; −17; 16; 16; etc.

These values are denoted by A1 through A13.

In FIG. 5A, the grouping of the output sequence in three partial sequences S1, S2, S3 with associated three partial sequence factors is shown. Within each partial sequence, the values are denoted by c1 through c12. The values of the three partial sequence factors are denoted by a1 through a13.

The period occurring in the partial sequence factors

15; −14; . . . 31 is boxed. It can be seen from the illustration that all three partial sequence factors have the same period, whereby the periods in the factors for S1, S2, and S3 are shifted with respect to each other by three positions. The periodicity (P) for the three partial sequence factors is (P)=10.

In this example, the number of different periods=1.

Figure 5B:
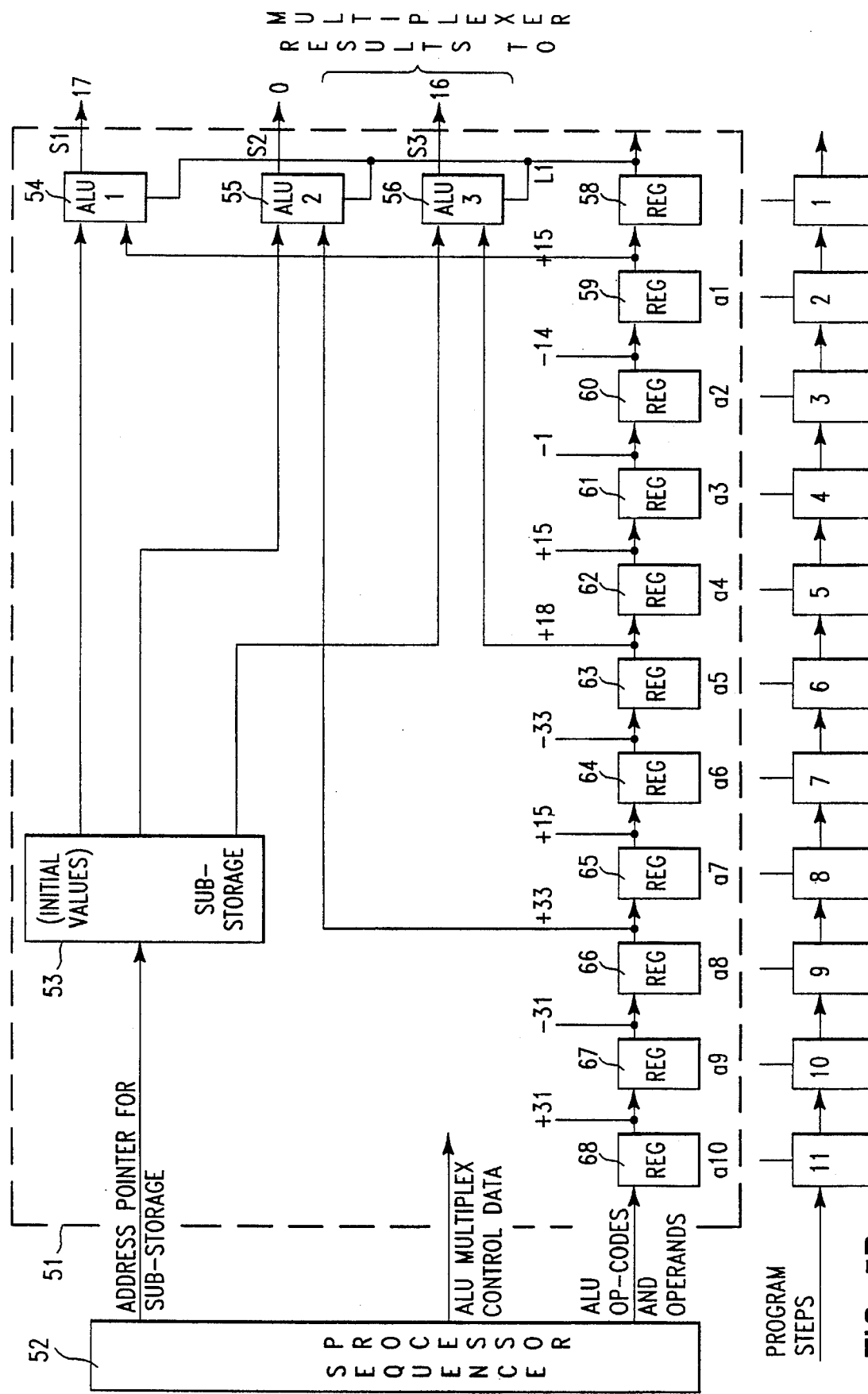
FIG. 5B is a block schematic of a processor-controlled circuit with multiple arithmetic and logic units (ALUs) for generating the three partial sequences of FIG. 5A.

FIG. 5B shows a schematic of a processor-controlled circuit, with whose help, given the three partial sequence factor period and the mutual shift of this period in the factors of the partial sequences, as well as the initial values for the individual partial sequences, the three partial sequences can be generated and combined via a multiplexer (not shown) to form the desired output sequence.

The circuit consists essentially of three parts: a sequence processor 52, a multi-ALU processor 51 (ALU=arithmetic and logic unit) and the multiplexer, which is not shown. The task of the sequence processor 52 is to address initial values for the three partial sequences and to provide control data for the multi-ALU processor 51 and the multiplexer, which is not shown.

Multi-ALU processor 51 contains as many ALUs 54, 55, 56 as there are partial sequences. In this example, there are three partial sequences S1, S2, and S3; thus, three ALUs are provided, which operate on different "levels". ALU 54 serves to generate the first partial sequence S1, ALU 55 the second partial sequence S2, and ALU 56 the third partial sequence S3. At the start, each ALU receives, by appropriate addressing of sub-storage 53 provided by sequence processor 52, the initial value for the partial sequence: thus, the initial value 17 is predetermined for ALU 54 for S1, the initial value 0 for ALU 55 for S2, and the initial value 16 for ALU 56 for S3. These values are passed to the ALU output and saved by latching them in respective ALU registers (not shown) for subsequent computation. An appropriate operation code is provided in register 58 for passing the initial values. This register is connected to the ALUs via line L1. In addition to sub storage 53, the various ALUs 54, 55, 56, and register 58, multi-ALU processor 51 contains another series of concatenated registers 59 through 68, which receive the individual values for the partial sequence factor period from sequence processor 52, including the + or − operation codes of the period values, i.e., their signs, as well as their absolute values as operands. Thus, register 59 initially contains the value a1=+15, register 60 the value a2=−14, etc., and register 68 the value a10=+31.

Register 59 is connected to ALU 54, register 63 to ALU 55, and register 66 to ALU 56.

After the aforementioned passing of the initial values of the partial sequences to the ALU outputs, the following operation is executed in a subsequent program step in each ALU: addition of the latched (saved) value in the ALU register of the previous program step to the value contained in the register corresponding to each ALU. In this manner, ALU 54 executes the operation

17+(+15)=32,

ALU 55 the operation

0+(+33)=33 and ALU 56 the operation

16+(+18)=34.

The results appear at the respective ALU outputs as the second value c2 of the partial sequence being generated and are latched for the next program step.

Before executing the next program step, the contents of registers 59 through 68 are cyclically shifted by one level in the direction of the arrow. Register 59 now contains the value −14, register 60 the value −1, etc., and register 68 the value +15 (from register 59). Then, ALU 54 executes the operation

32+(−14)=18

ALU 55 the operation

33+(−31)=2 and ALU 56 the operation

34+(−33)=1 to form the third value c3 of the partial sequences S1, S2, and S3. By continually latching the results and cyclically shifting the contents of registers 59 through 68, the partial sequences S1, S2, and S3 appear at the ALU outputs and are combined by the multiplexer, not shown, into the required output sequence.

The circuit shown in FIG. 5B illustrates, in contrast to the prior art circuit as shown in FIG. 2C, that the division of an output sequence into three partial sequences with a single partial sequence factor period means that only a single program storage means in the form of registers 58 through 68 and sub-storages 53 are required. The mutual shift of the periods in the partial sequence factors is taken into account by appropriately connecting the ALUs to the registers. Characteristic of multi-ALU processor 51 are the parallel-functioning ALUs.

Figure 5C:
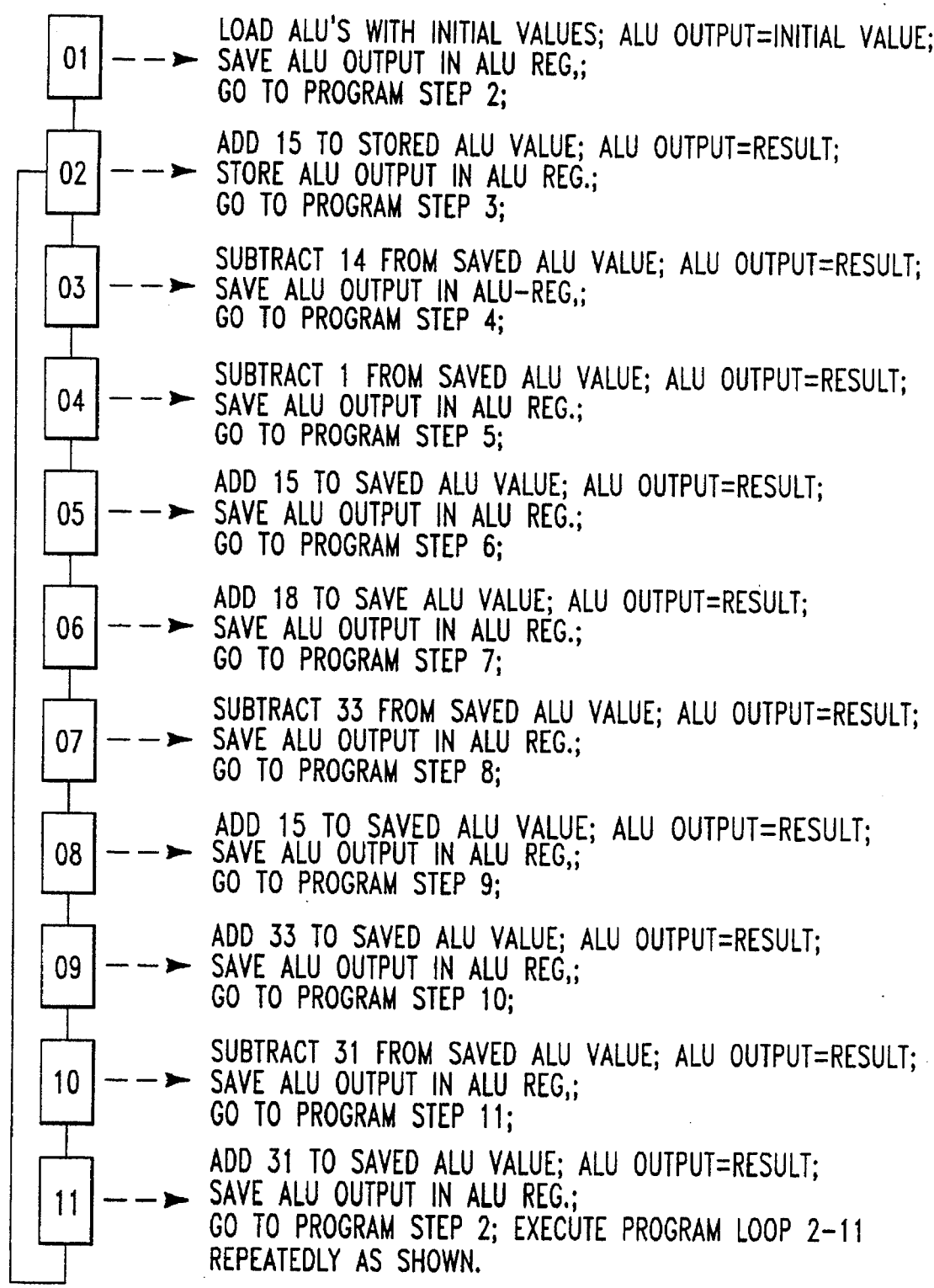
FIG. 5C schematically depicts the program for generating the three partial sequences in the circuit of FIG. 5B.

In the lower portion of FIG. 5B, individual program steps 0, 1, 2, . . . 11 are shown for producing the partial sequences by the ALUs. Details of this process are shown in FIG. 5C.

The function of the individual program steps is self-explanatory. Steps 01 through 03 have already been described in conjunction with FIG. 5B.

After the end of program step 11, the program branches back to program step 02 and thus forms a loop. This loop, comprising steps 02, 03, 04 through 11, is repeated as required, i.e., as long as the partial sequence period is to be processed through.

For a period common to all partial sequence factors, a programmable multi-ALU processor must provide the number of ALUs corresponding to the number of partial sequences.

Depending on the periodicity of the partial sequence factors, this multi-ALU processor 51 must also provide an appropriate number of registers to be loaded with the values of the partial sequence factor period. In addition, the mutual shift of the partial sequence factor period in the partial sequence factors must be taken into account by using appropriate programmable interconnections of individual registers with the corresponding ALUs. In other words, it is possible to configure a circuit (multi-ALU processor) such that it provides the desired output sequence via the formation of the partial sequences.

The prerequisites for this capability have already been explained: an assumed output sequence can, under program control be automatically examined to determine how many partial sequences require factors with a common period exhibiting more than one value.

All parameters so obtained (number of partial sequences, values of the partial sequence period and shift values of this period in the partial sequence factors) can be used to configure a multi-ALU processor 51 under program control such that it automatically generates the desired partial sequences, which are then combined via a multiplexer into the required output sequence.

In this manner, the address sequence, for example, for a test system based on a designated address test pattern, can be automatically generated via a program-controlled configuration of a multi-ALU processor.

It should be noted that in the special case in which the common period of all partial sequence factors consists of a single value, a constant, further optimizing circuit simplifications result. Such an example will be described in conjunction with FIG. 6.

In FIG. 6A, an output sequence (FIG. 4B) is shown with an factor periodicity of (P)=10 and division of this sequence into ten partial sequences (FIG. 4K) with associated ten partial sequence factors.

Figure 6C:
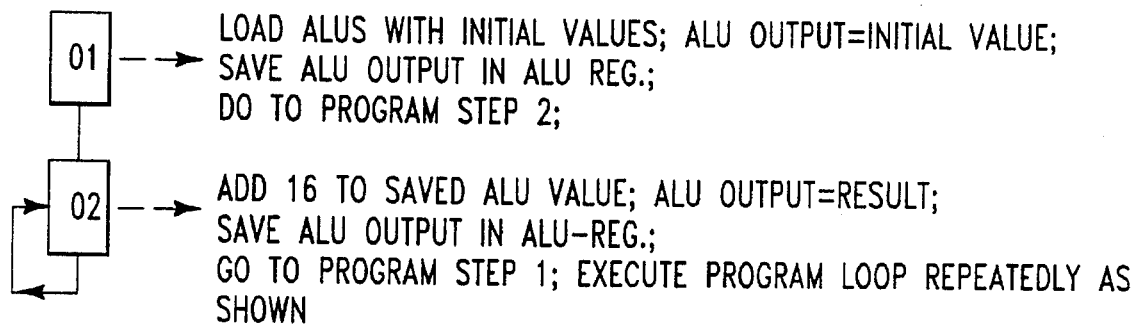
FIG. 6C is a schematic representation of the program for producing the ten partial sequences in the circuit of FIG. 6B.
Figure 6B:
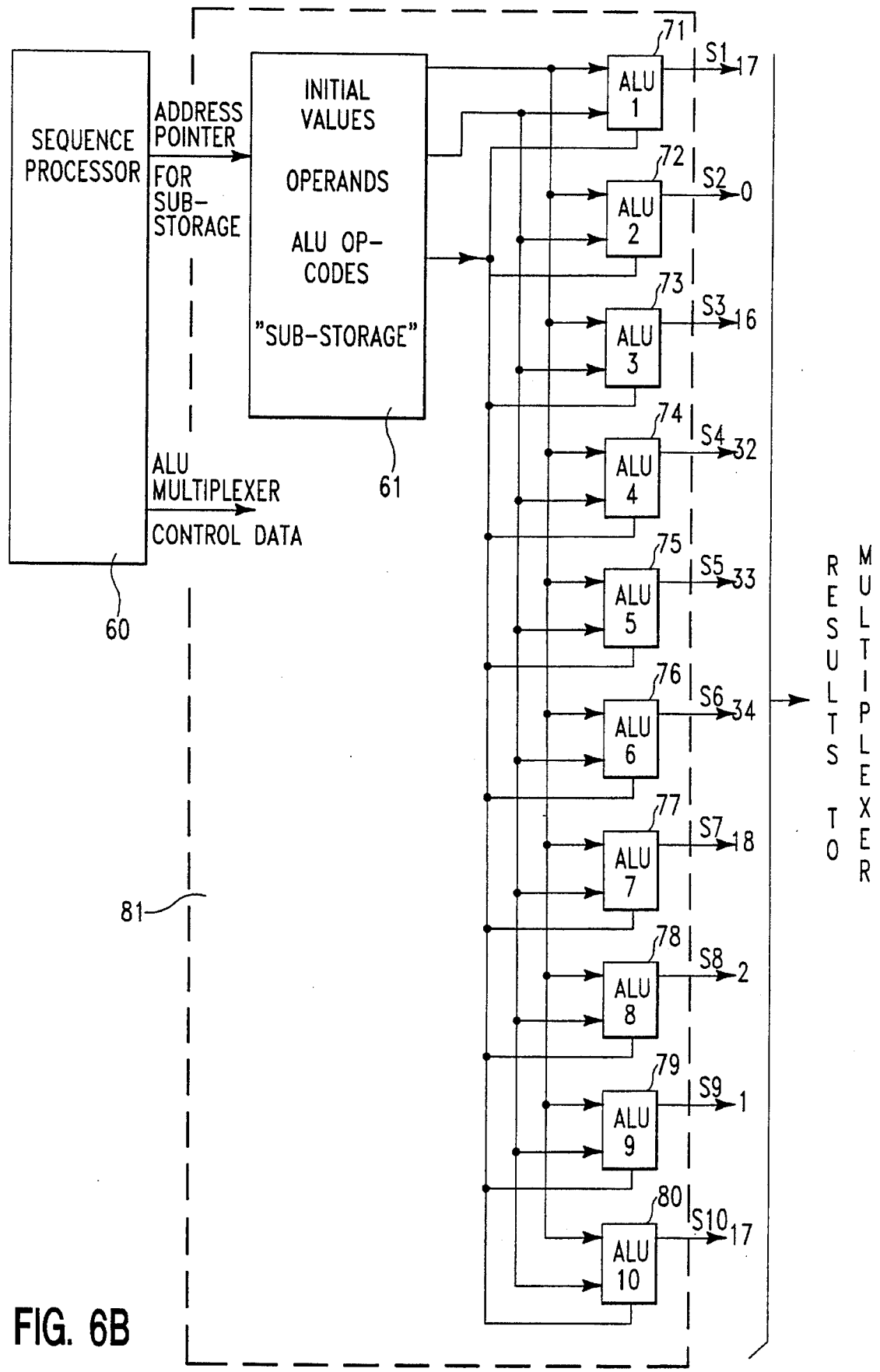
FIG. 6B is a block schematic of a processor-controlled circuit with multiple arithmetic and logic units (ALUs) for generating the ten partial sequences of FIG. 6A.

FIG. 6B shows a circuit for generating the partial sequences of FIG. 6A, from which the desired output sequence is formed.

The same conclusions apply to FIG. 6A as were stated in conjunction with FIGS. 4B and 4K.

For a periodicity (P)=10 of the output sequence, the values of the ten partial sequence factors are a constant 16. This in itself indicates a further circuit simplification compared to the circuit example in FIG. 5B with multiple registers (these were required because the partial sequence factor periods comprised multiple values). This is due to the fact that the number of different periods for the partial sequence factors in FIG. 6A is only 1; i.e., only one register, in FIG. 6B relocated to sub-storage 61, would ever be required.

According to the periodicity (P)=10 of the output sequence, ten different processors (ALUs) 71, 72, . . . 80 are provided. ALU 71 generates the first partial sequence S1, ALU 72 the second partial sequence S2, etc., and ALU 80 the tenth partial sequence S10. All partial sequences are combined via a multiplexer (not shown) into the desired output sequence.

The initial values for the individual partial sequences are stored in sub-storage 61 as operands (absolute values) and their signs + or − (ALU operation codes=ALU op-codes); in addition, sub-storage 61 contains the constant 16.

Sub-storage 61 is addressed by sequence processor 60, which also controls multi-ALU processor 81, comprising the ALUs and sub-storage 61, and the multiplexer (not shown).

In a first program step (see also FIG. 6C), the individual ALUs receive the initial values for their respective partial sequences from sub-storage 61. This initial value is passed to the ALU output. Thus, the value 17 appears at the output of ALU 71, etc., and the value 16 at the output of ALU 80. These output values, like all subsequent values, are saved in a register (not shown) of the respective ALU for the next program step.

In the second program step 02 (see also FIG. 6C), the constant 16 from sub-storage 61 is added to the value latched in the respective ALU register. The sum appears at the respective ALU output as the second value of the respective partial sequence. This result is again latched in the ALU register for adding the constant 16 in the next program step, etc.

In FIG. 6C, program steps 01 and 02 are shown in a schematic program flow diagram. Program step 02 is repeated as long as indicated by the length of the partial sequences.

While the values of the factors of the output sequence in FIGS. 1A, 1B, 3A, 3B; 4A, 4B; and 11 are formed from summands or subtrahends, FIG. 7 shows an example in which the values of the factor of the output sequence consist of multipliers or divisors.

The values of the output sequence

2; 4; 1, 3; 6; 1.5; 4.5; 9, 2.25; etc.

are shown generally as

C1; C2; C3; C4; C5; C6; C7; C8; C9; etc.

and the values of the factor (each comprising an operator such as a multiplication sign or division sign as well as the operand value)

×2; ÷4; ×3; ×2; ÷4; ×3; ×2; ÷4; etc.

are shown generally as

A1; A2; A3; A4; A5; A6; A7; A8; etc.

The output sequence is formed similarly as for the example in FIG. 3, i.e., a given value in the output sequence is derived by combining the preceding value with the corresponding factor value.

| C1 | Initial value |
|---|---|
| C2 = | C1 combined with A1 |
| C3 = | C2 combined with A2 |
| C4 = | C3 combined with A3 |
| C5 = | C4 combined with A4 |
| C6 = | C5 combined with A5 |
| etc. | |

Based on the A values shown, the following results are obtained:

| C1 | Initial value (= 2) |
|---|---|
| C2 | C1 2 |
| C3 = | C2 4 |
| C4 = | C3 3 |
| C5 = | C4 2 |
| C6 = | C5 4 |
| etc. | |

As can be seen from the upper portion of FIG. 7, the factor of the output sequence exhibits a periodicity of (P)=3: the period comprises three values, namely ×2; ÷4; ×3.

If the output sequence, based on (P)=3, is divided into three partial sequences S1, S2, and S3, with associated three partial sequence factors, it is shown that, as for the examples in FIGS. 3I, 4K, and 11, the values of the three partial sequence factors for all three partial sequences are identical, consisting of the multiplier "×1.5".

The general and specific relationships between the first partial sequence S1, with general values c1, c2, c3, etc., and the values a1, a2, a3, etc. of the respective three partial sequence factor are as follows:

c1 Initial value c2=c1 combined with a1 c3=c2 combined with a2 etc.

and, specifically, c1=2 c2=2×1.5 c3=c2×1.5 etc.

A detailed illustration of the grouping of the output sequence shown in FIG. 7 into two, three, four, etc., partial sequences is not shown, since the principle of such groupings has already been described in conjunction with FIGS. 3 and 4.

It is again interesting, however, how relatively simply the partial sequence factor value can be determined when the periodicity (here 3) is identical to the number of partial sequences.

The partial sequence factor value (here multiplier "×1.5") is derived simply by combining the values of the output sequence factor period:

×2÷4×3=×1.5

Figure 10:
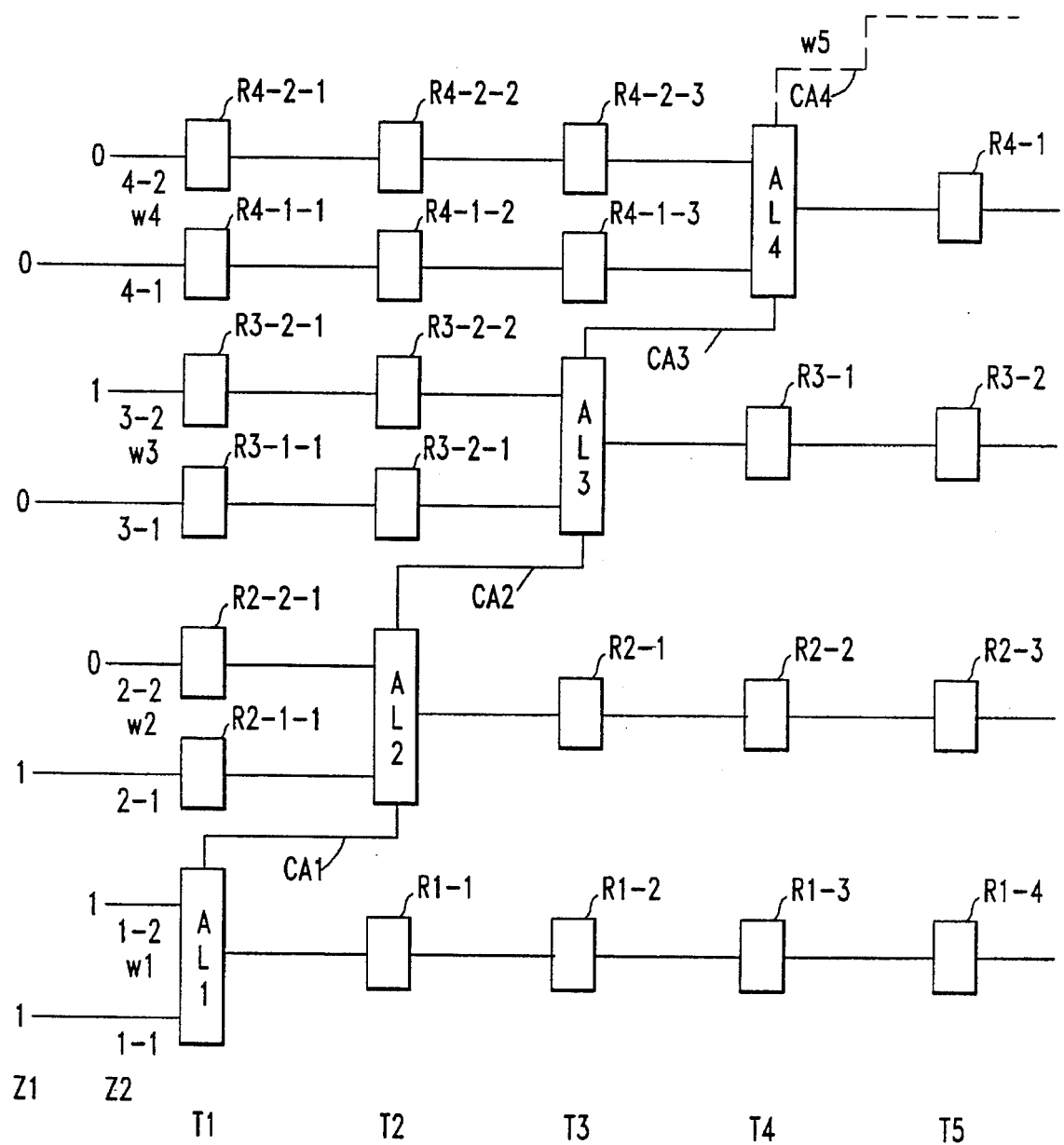
FIG. 10 is a schematic representation of an ALU divided into sub-ALUs, with registers series-connected to the inputs and the outputs of the sub-ALUs.

For this example as well, the advantages shown in FIGS. 10 and 11 are apparent in the case of a program-controlled configuration of a processor-controlled circuit: for generating the output sequence, only (here) three processors and a single program storage means (for the partial sequence factor value "×1.5", excluding the initial values of the partial sequences) are needed to generate the partial sequences.

FIG. 8 illustrates an output sequence with a periodic factor whose values represent complex, subroutine-like arithmetic operations. Furthermore, it shows a grouping of the output sequence into three partial sequences with associated three partial sequence factors.

The output sequence

C1; C2; C3; C4; C5; C6; etc.

has the values 1.000; 3.313; 2,978; 1,091; 3.386; 3.466; etc.

The factor of the output sequence

A1; A2; A3; A4; A5; A6; etc.

has the values (again including operators and operands)

(C1+π)×0.8; (C2²−8; ln(C3); (C4+π)×0.8; C5²−8; ln(C6)

The values of the output sequence are formed as follows:

| C1 | Initial value |
|---|---|
| C2 = | (C1 + π) × 0.8 |
| C3 = | (C2² − 8) |
| C4 = | ln (C3) |
| C5 = | (C4 + π) × 0.8 |
| C6 = | (C5² − 8) |
| C7 = | ln (C6) |
| etc. | |

The factor of the output sequence has a periodicity of (P)=3, corresponding to the three values framed by the horizontal bracket.

Based on the periodicity of 3, a grouping is shown in three partial sequences S1, S2, and S3 with the respective values c1, c2, c3, etc.

As in the case of the aforementioned rule, the partial sequence factor value is derived by combining A1, A2, and A3 (values of the output sequence factor period):

ln [{(C1+π)×0.8}²−8]

In application to the partial sequences, C1 must be replaced with c1. Due to the increasing c values in the partial sequence (here S1), c1 can be generally formulated as:

$C_n = \ln [\{(C_{n+1} + \pi) \times 0.8\}^2 - 8]$   n = 2, 3, 4, 5, etc.

This partial sequence factor value, formed from complex arithmetic operations, has the attribute that the order of the arithmetic operations must be considered. Since the partial sequence S2 begins with C2 (=c1 in S2), the partial sequence factor value (according to the combination A2/A3/A1, now beginning with A2) is here $$C_n = [\ln (C_{n-1}^2 - 8) + \pi] \times 0.8 \qquad n = 2, 3, 4, 5, \text{etc.}$$

Similarly, the partial sequence factor value for partial sequence S3 (considering the operation sequence A3/A1/A2) is $$C_n = \{(\ln C_{n-1} + \pi] \times 0.8\}^2 - 8 \qquad n = 2, 3, 4, 5, \text{etc.}$$

In this example, too, for a programmed configuration of a processor-controlled circuit, three processors and a single program storage means for storing the (in this example, quite complex) partial sequence factor value are required to generate the three partial sequences. In this case, however, this partial sequence factor value must be adapted to each partial sequence, i.e., must consider the order of the operations derived from the values of the output sequence factor period.

This example of FIG. 8 can be generalized such that the values of the output sequence factors can also be very complex arithmetic operations (including addition, subtraction, multiplication, division, and logarithm derivation). Such complex operations can represent entire subroutines.

For applications in which output sequences are constructed with the aid of such periodic factoric operations, a processor-controlled circuit can be optimally configured under program control for the case of generating Y partial sequences (Y=number of values in the output sequence factor period), from which the output sequence is then produced.

Figure 9:
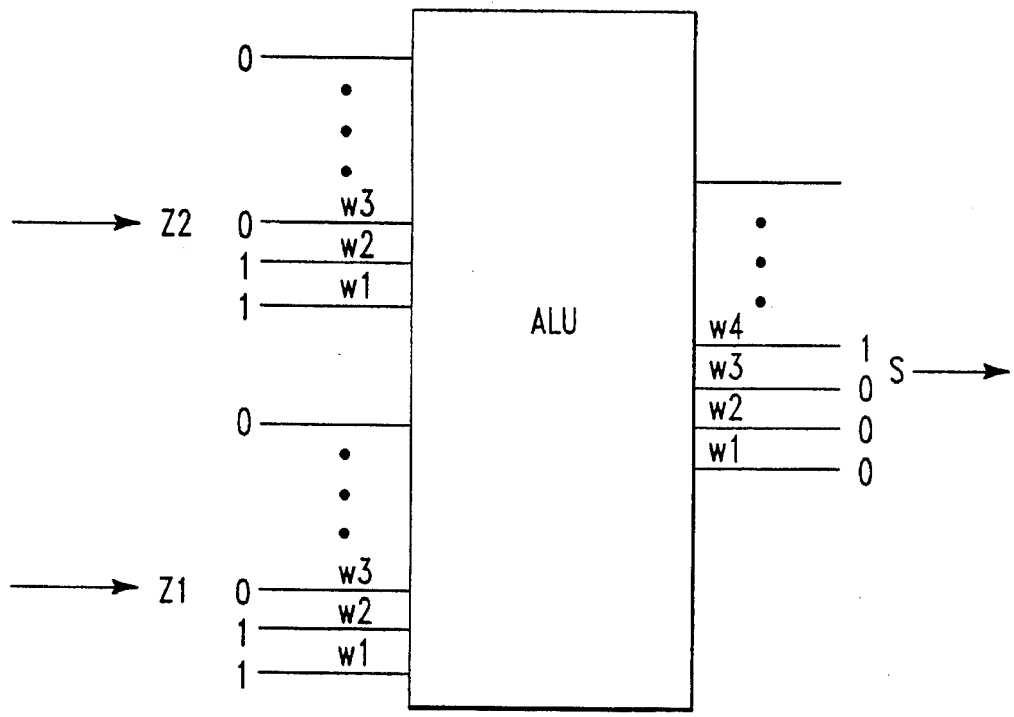
FIG. 9 is a schematic representation of an arithmetic and logic unit (ALU) constructed on the customary binary level basis, in conjunction with an add operation.

FIG. 9 is a schematic representation of an arithmetic and logic unit (ALU) for combining two binary numbers Z1 (0101) and Z2 (0011). The binary positions for the individual numbers are indicated in ascending order of significance by w1, w2, w3, etc.

The result S (1000) of the operation (in this example, an addition) is available on the ALU output lines with the binary positions w1, w2, w3, etc.

In ALUs known in the art, the combination of two numbers begins with the lowest position w1, possibly with formation of a carry, which must then be included in the subsequent combination of the values for the next higher position w2.

In this manner, combining numbers comprising many binary positions requires long time delays. These are due to the fact that the combination for a higher position, possibly including a carry, can proceed only after completion of the combination for the next lower position.

Techniques (so-called carry-look-ahead circuits) are known in the art which limit these long time delays. Such a solution is described in "Motorola MECL Integrated Circuits", Series F 1989, pp. 2–77 and 2–81; the technique does not involve Boolean operations under clock control and delivers only slight reductions in the time delays.

In the circuit design using ALUs of the present invention, novel, advantageous improvements allow shortened computation time. The reason for this lies in avoiding the time delays which arise for conventional ALUs due to carries.

FIG. 10 schematically illustrates an ALU partitioned into sub-ALUs (AL1, AL2, AL3; AL4). Each sub-ALU is assigned to a binary position of the number. In the binary system, the lowest binary position has the value $w1=2^0=1$; the next higher binary position $w2=2^1=2$, followed by $w3=2^2=4$, $w4=2^3=8$, etc.

The addition of Z1 and Z2 starts with the addition at the lowest position w1. Any carry is included in the subsequent addition for the next higher position w2. A carry at this position is likewise included in the addition for the third position w3, etc.

This also involves time delays, of course, but except for an initialization phase they can be avoided using the circuit shown in FIG. 10.

The AL2 addition takes place only after completion of the preceding AL1 addition for the operand inputs 1-1 and 1-2 of AL1 (binary operands "1" from Z1 and "0" from Z2). Any carry is applied via line CA1 to the subsequent AL2 addition.

Similar observations hold true for subsequent additions at the increasingly higher positions.

For the individual ALUs, depending on the position value assignment w1, w2, w3, etc., registers are connected in front of the operand inputs; the higher the position value, the more registers are needed. On the other hand, depending on the position value, registers are connected following the outputs of the sub-ALUs; the lower the position, the more registers are needed.

These registers have special significance for additions of successive numbers, i.e., when further additions (not shown) follow the addition of Z1 and Z2.

For the example of FIG. 10, the four-digit binary numbers

| (Z1) | 0 0 1 1 and |
|------|-------------|
| (Z2) | 0 1 0 1     | are to be added.

The number four determines the number of sub-ALUs (AL1, AL2, AL3, AL4, i.e., also four).

Sub-ALU AL1 has two operand inputs: 1-2 for the binary value "1" at the lowest position w1 of number Z1 and 1-2 for the binary value "1" at the lowest position w1 of the number Z2, a carry output CA1 (leading to sub-ALU AL2), and registers R1-1, R1-2, R1-3, and R1-4 connected in series to the sub-ALU output. The number of these registers corresponds to the four binary digits.

A register is connected in series to each of the operand inputs of sub-ALU AL2 for the operand input for position w2 of number Z1, this is register R2-1-1, and for position w2 of number Z2 this is register R2-2-1. This register, R2-2-1, receives the binary value "0" at position w2 of number Z2 on line 2-2, while register R2-1-1 receives the binary value "1" of number Z2 on line 2-1. The carry line of register AL2 is connected to AL3. Registers R1-1, R2-2, and R2-3 are connected to the AL2 output.

For sub-ALU AL3, assigned to the third position w3, registers R3-1-1 and R3-1-2 are connected to the AL3 operand input for the w3 position of Z1 and registers R3-2-1 and R3-2-2 for the corresponding position of Z2. The binary value "0" from Z1 is placed on line 3-1 to R3-1-1, and the binary value "1" from Z2 is placed on line 3-2 to R3-2-1. The AL3 carry line CA3 is connected to AL4. Registers R3-1 and R3-2 are connected to the AL3 output.

Three registers are connected in series to each of the operand inputs of ALU AL4. The binary value "0" of position w4 of Z1 is applied on line 4-1 via registers R4-1-1, R4-1-2, and R4-1-3 to one operand input of AL4, while the value "0" of position w4 of Z2 is applied on line 4-2 via registers R4-2-1, R4-2-2, and R4-2-3 to the second AL4 operand input. The carry line of AL4 is designated by CA4. Register R4-1 is connected to the AL4 output.

To maintain clarity, lines defining the type of operation (addition, subtraction, multiplication, division, etc.) have not been shown.

The registers in FIG. 10 are centrally clocked from left to right, as are the sub-ALUs in the computation sequence AL1, AL2, AL3, AL4. Here, it is ensured that, for example, AL2 executes an operation only after the operation in AL1, including carry formation, has been completed. Similar observations apply to AL3 with respect to AL2 and AL4 with respect to AL3.

The following describes how the addition of Z1 and Z2 is carried out at the individual sub-ALU levels:

At an initial time, the binary values 1, 1, 0, 0 for Z1 appear on lines 1-1, 2-1, 3-1, and 4-1, and the binary values 1, 0, 1, 0 for Z2 appear on the lines 1-2, 2-2, 3-2, and 4-2.

In the first clock interval T1, the addition of "1" and "1" by AL1 is carried out at the w1 level, the binary value "1" is loaded into register R2-1-1 and the binary value "0" into register R2-2-1, at the w2 level, the binary value "0" is loaded into register R3-1-1 and the binary value "1" into register R3-2-1, at the w3 level, and the binary value "0" is loaded into register R4-1-1 and the binary value "0" into register R4-2-1, at the w4 level.

In the next clock interval T2, the preceding AL1 addition result is loaded into register R1-1, the addition of "1" and "0" (these values were previously in R2-1-1 and R2-2-1) takes place in AL2, the value ("1") from R3-1-1 is loaded into register R3-1-2 and the value ("1") from R3-2-1 is loaded into register R3-2-2, and the value ("0") from register R4-1-1 is loaded into register R4-1-2 and the value ("0") from R4-2-1 is loaded into register R4-2-2.

During clock interval T3, similar operations take place. The contents of R1-1 shift into R1-2, the AL2 addition result shifts into register R3-1, and an AL3 addition of the values previously loaded in registers R3-1-2 and R3-2-2 occurs, allowing of course, as for the other levels, for a possible carry from the preceding addition at the next lower level, and the contents of R4-1-2 shifts into R4-1-3 and of the contents of R4-2-2 shifts into R4-2-3.

After the fifth clock interval T5, the addition result of Z1 and Z2, corresponding to the value positions w1, w2, w3, w4, and w5, is available in registers R1-4, R2-3, R3-2, R4-1, and (simplified) on line CA4. This result can be accessed at the same time.

The advantages of the circuit shown in FIG. 9 are evident only after an "initialization phase", for example, for successive addition of numbers Z1+Z2, Z3+Z4, Z5+Z6, etc.:

With each clock interval, the binary values of two numbers in the positions w1, w2, w3, and w4 are shifted or combined in registers. In each successive clock interval, the binary values of succeeding numbers follow.

Since all sub-ALUs operate concurrently, the addition results are available at the same time after each clock interval in registers R1-4, R2-3, R3-2, and R4-1.

The clock sequence can be as fast as the shift of the contents from one register to the next or the formation of a carry in a sub-ALU allows. This clock sequence is significantly faster than in conventional arithmetic and logic units, where the result computation requires that, from the lowest to the highest level, each binary value position await the carry from the previous position.

Even the aforementioned improvements, the carry-look-ahead circuits, are insufficient to accommodate high-speed processor operation.

The considerations discussed in conjunction with partitioning of an ALU can be applied to binary counters as well. Here, time delays are also common in the art. They are due to the fact that the result at a next higher level can be computed only when the result at the next lower level, including any carry, is complete.

In such counters, partitioning into individual sub-counters with appropriate (FIG. 10) series-connected input and output registers for successive count operations permits great speed improvement.

FIG. 11 shows a simplified representation of an example of an output sequence with an factor period of three values in conjunction with three partial sequences, with a partial sequence factor constant K=3, as well as a representation of a circuit comprising three processors for generating the three partial sequences to form the output sequence.

The output sequence is given in the upper portion of the figure, with the values 8; 12; 10; 11; 15; 13; 14; 18; etc.

Underneath (staggered with respect to the values of the output sequence), the values of the factor of the output sequence appear:

+1,; +4; −2; −1; 4; −2; 1; 4; etc.

The lines joining the values of the output sequences and the factor indicate that by adding a value of the output sequence to the corresponding value of the factor, the next value of the output sequence is produced,

| for example |
| --- |
| 7 + 1 = 8 |
| 8 + 4 = 12, etc. |

Underneath on the left, the output sequence values

8; 12; . . . 18; etc.

corresponding to the general notation

C1; C2; C3; . . . C18; etc., are given, and on the right the values of the factor of the output sequence 1; 4; −2; 1; 4; −2; 1; etc.

corresponding to the general notation

A1; A2; A3; A4; A5; . . . A7; . . .

are indicated.

The periodicity of the factor is shown by the bracket and the expression (P)=3. (P)=3 means that the period comprises three values (here, 1; 4; −2).

In the middle portion of FIG. 11, the grouping of the output sequence is shown into three partial sequences S1=7; 10; 13; etc.

S2=8; 11; 14; etc.

S3=12; 15; 18; etc.

with the associated partial sequence factors

| for S1 | 3; 3; 3; etc. |
| --- | --- |
| for S2 | 3; 3; 3; etc. |
| for S3 | 3; 3; 3; etc. |

The values of the partial sequences are assigned the notation

S1=$s_{11}$; $s_{12}$; $s_{13}$; etc.

S2=$s_{21}$; $s_{22}$; $s_{23}$, etc.

S3=$s_{31}$; $s_{32}$; $s_{33}$; etc.

and the values of the associated partial sequence factors are assigned the notations:

for S1 $as_{11}$; $as_{12}$; $as_{13}$; etc.

for S2 $as_{21}$; $as_{22}$; $as_{23}$; etc.

for S3 $as_{31}$; $as_{32}$; $as_{33}$; etc.

The lower portion of the figure contains a block diagram of a circuit for generating the output sequence from the initial values of the partial sequences and the constant K=3, the value of all partial sequence factors. In accordance with (P)=3, there are three processors: processor 1 90, processor 2 91 and processor 3 92. Each processor has an assigned partial sequence: processor 1 is assigned to partial sequence S1, processor 2 to partial sequence S2, and processor 3 to partial sequence S3. Each processor generates, from the initial value of the respective partial sequence and the constant K=3 in program storage means 93, the respective partial sequence S1, S2, or S3 by successive addition as follows:

$$S_{12} + K = s13$$
$$S_{13} + K = s14$$
etc.
$$S_{22} + K = S_{23}$$
$$S_{23} + K = S_{24}$$
etc.
and
$$S_{32} + K = S_{33}$$
$$S_{33} + K = S^{34}$$
etc.

which are then combined by multiplexer 95 to form the desired output sequence.

For clocking the operations, a clock circuit 94 is provided, which is connected to program storage means 93, processors 90, 91, and 92, and multiplexer 95.

It should be understood that although the invention has been described with respect to a preferred embodiment, that one skilled in the art can, from the foregoing, readily make changes in form and detail without departing from the spirit and scope of the invention.

What is claimed is:

1. A method for configuring of a processor-controlled circuit for generating an factorically producible sequence of values comprising the steps of;

determining a sequence of values to be generated;

C1; C2; C3; C4; C5; C6; C7; C8; ... CN;

determining from the sequence of values to be generated a series of sequence factors;

A1; A2; A3; A4; A5; A6; A7; A8; ... AN.

the first factor in said series of said factors having a value which, when added to said initial value in said sequence of values, will provide an obtained result which, when added to the next factor in the sequence of factors, will result in the next value in the sequence of values so that each value in the sequence of values when added to the next factor in the series of factors results in the next value in the sequence of values;

arranging the determined sequence factors in said series in respective periods of recurring values;

each period containing the same number of values as any other period;

determining the number of the factors occurring during a period;

creating a plurality of partial sequences from the sequence of values equal in number to the number of factors occurring in a period;

each partial sequence having a partial sequence factor equal to a constant value; and configuring a multi-processor circuit;

wherein said multi-processor comprises:

a plurality processors, each having an input and an output, corresponding in number to the number of partial sequences and each processor producing a respective partial sequence;

each respective processor receiving the initial value of each respective partial sequence and further being coupled to a program storage means containing said constant so that said constant can be added to the initial received value to form the next value in said partial sequence and can be successively added to said formed next value to form a further next value to generate each successive value of said partial sequence; and a multiplexor circuit coupled to the output of each respective processor to combine all the partial sequences to generate the determined sequence of values.

2. The method of claim 1 wherein;

the program storage means comprises a plurality of interconnected registers equal in number to the number of values contained in the period;

each of said registers storing a value of the period; and each of said processors being connected to a respective register for cycling the values stored in the register to generate the partial sequences.

3. The method of claim 2, wherein the processors are arithmetic and logic units (ALU) each containing a latch circuit.

4. A circuit for generating, on the basis of a periodic factor, an output sequence of values

C1; C2; C3; C4; C5; C6; ... CN.

comprised of;

a plurality of processors, each processor adapted to generate a partial sequence by combining a partial sequence factor period and the initial value of a partial sequence;

the number of processors being equal to the number of partial sequences;

a single program storage means for storing the value of a partial sequence period coupled to all of said processors;

the program storage means comprising a plurality of registers connected in series for receiving and cycling through the values of the partial sequence factor period, and that each processor is connected to one of said series of registers; and a multiplexor circuit coupled to all of said processors for combining all said partial sequences into the output sequence.

5. The circuit of claim 4 wherein said processors each comprise an arithmetic and logic unit (ALU) for executing arithmetic operations for operands existing as binary values in a plurality of positions, each said ALU having an operand input, a carry input, an operand output, and a carry output, and each said ALU is subdivided into a plurality of sub-ALU's equal to the number of said positions, each of which is associated with a binary value position of the operands in an ascending order;

the operand inputs of each sub-ALU being preceded by series-connected registers and the output of each sub-ALU being followed by series-connected registers; and the carry output of each sub-ALU is connected to a carry input of the following sub-ALU.

6. The circuit of claim 4 wherein said circuit is a binary counter and each ALU is divided into a plurality of sub-levels, each of which sub-level corresponds to a binary value position in ascending order;

a selected number of said registers are series-connected to the operand input of each said ALU sublevel and a selected number of registers are series-connected to the output of each said ALU sub-level; and the carry output of the each sub-level is connected to the carry input of the adjacent ALU sub-level.

* * * * *